(12) United States Patent
Sugawa et al.

(10) Patent No.: US 7,863,925 B2
(45) Date of Patent: Jan. 4, 2011

(54) TEST CIRCUIT, WAFER, MEASURING APPARATUS, AND MEASURING METHOD

(75) Inventors: Shigetoshi Sugawa, Miyagi (JP); Akinobu Teramoto, Miyagi (JP)

(73) Assignee: National University Corporation Tohoku University, Miyagi (JP)

( * ) Notice: Subject to any disclaimer, the term of this patent is extended or adjusted under 35 U.S.C. 154(b) by 158 days.

(21) Appl. No.: 11/857,444

(22) Filed: Sep. 19, 2007

(65) Prior Publication Data
US 2008/0224725 A1 Sep. 18, 2008

Related U.S. Application Data

(63) Continuation of application No. PCT/JP2005/012359, filed on Jul. 4, 2005.

(51) Int. Cl.
*G01R 31/26* (2006.01)
(52) U.S. Cl. ...................................... 324/769
(58) Field of Classification Search ................. None
See application file for complete search history.

(56) References Cited

U.S. PATENT DOCUMENTS 5,149,993 A 9/1992 Kikuchi et al.
5,258,958 A * 11/1993 Iwahashi et al. ........ 365/185.21
5,774,008 A * 6/1998 Shou et al. ................... 327/361
6,897,674 B2 * 5/2005 Braceras et al. ............. 324/765
7,180,320 B2 * 2/2007 Braceras et al. ............. 324/765
2004/0032278 A1 * 2/2004 Orii et al. .................... 324/765
2004/0263199 A1 * 12/2004 Braceras et al. ............. 324/768
2005/0200377 A1 * 9/2005 Orii et al. .................... 324/770
2008/0238964 A1 * 10/2008 Umeda ........................ 327/108

FOREIGN PATENT DOCUMENTS

| JP | 03-204959 | 9/1991 |
| JP | 10-223707 | 8/1998 |
| KR | 19930007488 | 8/1993 |

OTHER PUBLICATIONS

"Office Action of Korean counterpart application", issued on Aug. 31, 2009, p. 1-p. 7.
"First Office Action of China Counterpart Application", issued by theSIPO of P.R. China on May 22, 2009.

* cited by examiner

*Primary Examiner*—Jermele M Hollington
(74) *Attorney, Agent, or Firm*—Jianq Chyun IP Office

(57) ABSTRACT

There is provided a wafer on which a plurality of electronic devices and circuits under test are to be formed, where each circuit under test includes a plurality of transistors under measurement provided in electrically parallel, a selecting section which sequentially selects the respective transistors under measurement, and an output section which sequentially outputs the source voltages of the transistors under measurement sequentially selected by the selecting section.

18 Claims, 14 Drawing Sheets

TEST CIRCUIT, WAFER, MEASURING APPARATUS, AND MEASURING METHOD

CROSS REFERENCE TO RELATED APPLICATION

This is a continuation application of PCT/JP2005/012359 filed on Jul. 4, 2005, the contents of which are incorporated herein by reference.

BACKGROUND

1. Field of the Invention

The present invention relates to a circuit under test, a wafer on which a plurality of electronic devices such as semiconductor circuits, etc. are formed, a measuring apparatus and measuring method for measuring an electric characteristic of the wafer, a device manufacturing method for discriminating electronic devices according to unevenness in the electric characteristic of the wafer, and a display apparatus which displays the unevenness in the electric characteristic. Particularly, the present invention relates to a wafer on which a circuit under test such as a TEG (Test Element Group), etc. is formed.

2. Related Art

Recently, semiconductor elements have come to be manufactured with significantly reduced physical dimensions. Along with the dimensional reduction of the elements, the dimensions of defects, which impact the characteristics of the elements, have also been reduced. The dimensional reductions of semiconductor elements and defects have increased unevenness in the characteristics of the elements, which raises a problem in manufacturing a circuit. For example, large unevenness in the threshold voltage, current-voltage characteristic, etc. of MOS transistors gives a great impact on the reliability of the whole circuit and the circuit manufacturing yield.

Further, in addition to such statistical unevenness as described above, local defects such as bit defects, spot defects, etc., which occur at the rate of about a few circuits out of 10,000 to 1,000,000 circuits, are also a factor that influences the reliability and yield of the circuits, raising a problem as well in manufacturing circuits.

As a method for improving the device reliability and manufacturing yield, a possible way is to design a circuit according to the unevenness in the characteristic of elements. That is, by designing a circuit in a manner to tolerate the unevenness, it is possible to improve the device reliability and yield.

Known as a conventional method for measuring unevenness of elements is a method of providing a plurality of TEGs on a wafer on which a plurality of semiconductor circuits are to be formed, and evaluating the characteristic of a plurality of individual elements included in each TEG. That is, the individual elements included in the TEGs are formed through a similar process to that through which elements to be used in actual operation of the circuits are formed, and unevenness in the characteristic of the elements for actual operation are estimated based on the unevenness in the characteristic of the individual elements included in the TEGs.

Presently, no related patent literature has been identified, so indication of any literature is omitted.

However, according to conventional TEGs, a wafer is provided with only a few tens of individual elements to be included in the TEGs, which are through the same process and of the same device size. Hence, measurement of a characteristic cannot be conducted on many elements and unevenness in the characteristic cannot be evaluated accurately. Accordingly, in conventional device designing, it is necessary to build a design having excessive tolerance for unevenness (worst-case design). As a result, the area efficiency of the elements gets worse to cause a problem of increase in the circuit manufacturing costs. Furthermore, such a worst-case design might allow no circuit design using recent semiconductor elements, which are becoming smaller and smaller in size.

What is more, with conventional TEGs, it is impossible to identify the cause of defects which occur locally in the circuits prepared for actual operation. Hence, for identification of defects that occur locally, it is necessary to identify them by evaluating the actual operation circuits which have gone through the whole manufacturing process, requiring a lot of costs and time.

SUMMARY

Hence, according to one aspect of the innovation included herein, an object is to provide a circuit under test, a wafer, a measuring apparatus, a measuring method, a device manufacturing method, and a display apparatus which can solve the above-described problem. This object is achieved by combinations of features set forth in independent claims in the scope of claims. Dependent claims define further additional specific examples of the present invention.

That is, according to one exemplary circuit under test according to a first aspect related to the innovation included herein, there is provided a circuit under test, including: a plurality of transistors under measurement provided in electrically parallel; a selecting section which sequentially selects the respective transistors under measurement; and an output section which sequentially outputs source voltages of the transistors under measurement selected sequentially by the selecting section.

According to one exemplary wafer according to a second aspect related to the innovation included herein, there is provided a wafer on which the circuit under test according to the first aspect described above is provided on a boundary between respective semiconductor circuits.

According to one exemplary wafer according to a third aspect related to the innovation included herein, there is provided a wafer, including a plurality of the circuits under test according to the first aspect described above, where each of the circuits under test is provided inside a corresponding semiconductor circuit.

According to one exemplary measuring apparatus according to a fourth aspect related to the innovation included herein, there is provided a measuring apparatus for measuring an electric characteristic of the circuit under test according to the first aspect described above, including: a gate control section which controls each of the gate voltage control sections to apply the gate voltage for controlling the corresponding transistor under measurement to be ON, to the gate terminal of the corresponding transistor under measurement; and a characteristic measuring section which calculates a threshold voltage of each of the transistors under measurement, based on the gate voltage of the transistor under measurement and the source voltage of the transistor under measurement output from the output section.

According to one exemplary measuring apparatus according to a fifth aspect related to the innovation included herein, there is provided a measuring apparatus for measuring an electric characteristic of the circuit under test according to the first aspect, including: a gate control section which controls the respective switching transistors to sequentially apply the gate voltage for turning the corresponding transistors under measurement ON and the gate voltage for turning the corresponding transistors under measurement OFF, to the transistors under measurement; and a characteristic measuring section which measures the source voltage of each of the transistors under measurement when it is turned ON and the source voltage of the transistor under measurement when a predetermined period passes after it is switched from ON to OFF, to calculate a leak current in the PN junction based on a change in the source voltage.

According to one exemplary circuit under test according to a sixth aspect related to the innovation included herein, there is provided a circuit under test, including: a plurality of transistors under measurement which are provided in electrically parallel; a plurality of gate voltage control sections which are provided correspondingly to the plurality of transistors under measurement, for applying a predetermined gate voltage to gate terminals of the corresponding transistors under measurement; a plurality of voltage applying sections which are provided correspondingly to the plurality of transistors under measurement to apply voltages to source terminals and drain terminals of the corresponding transistors under measurement such that a voltage applied to gate insulating films of the transistors under measurement is controlled to be generally constant; integral capacitors which are provided correspondingly to the plurality of transistors under measurement to integrate gate leak currents output from the source terminals and the drain terminals of the corresponding transistors under measurement; a selecting section which selects the respective transistors under measurement sequentially; and an output section which sequentially outputs voltages of the integral capacitors corresponding to the transistors under measurement sequentially selected by the selecting section.

According to one exemplary measuring apparatus according to a seventh aspect related to the innovation included herein, there is provided a measuring apparatus for measuring a characteristic of the circuit under test according to the sixth aspect described above, including: a control section which controls the gate voltage control section to apply a predetermined gate voltage to the gate terminal of the transistor under measurement and controls the voltage applying section to control an electric field applied to the gate insulating film of the transistor under measurement to be generally constant; and a characteristic measuring section which calculates a gate leak current of each of the transistors under measurement based on an amount of change in the voltage output from the output section during a predetermined period.

According to one exemplary device manufacturing method according to an eighth aspect related to the innovation included herein, there is provided a device manufacturing method, including: forming the plurality of electronic devices on a wafer; forming a plurality of circuits under test on the wafer; measuring electric characteristics of the plurality of circuits under test; and judging whether the respective electronic devices are good or defective, based on positions at which the plurality of circuits under test are provided and the electric characteristics of the respective circuits under test.

According to one exemplary display apparatus according to a ninth aspect related to the innovation included herein, there is provided a display apparatus for displaying unevenness in threshold voltages of a plurality of transistors under measurement provided on a wafer, including: a measuring apparatus which measures the threshold voltage of each of the transistors under measurement; a storage section which stores the threshold voltage of each of the transistors under measurement measured by the measuring apparatus in association with a position of the transistor under measurement within a surface of the wafer; and a display section which displays characteristic information corresponding to a voltage value of the threshold voltage of each of the transistors under measurement at coordinates corresponding to the position of the transistor under measurement, on a display surface which corresponds to a surface portion of the wafer.

According to one exemplary display apparatus according to a tenth aspect related to the innovation included herein, there is provided a display apparatus for displaying unevenness in threshold voltages of a plurality of transistors under measurement provided on a substrate, including: a measuring apparatus which measures a threshold voltage of each of the transistors under measurement; a storage section which stores the threshold voltage of each of the transistors under measurement measured by the measuring section in association with a position of the transistor under measurement within a surface of the wafer; and a display section which displays characteristic information corresponding to a voltage value of the threshold voltage of each of the transistors under measurement, correspondingly to the position of the transistor under measurement, on a display surface which corresponds to a surface portion of the substrate.

According to one exemplary measuring method according to an eleventh aspect related to the innovation included herein, there is provided a measuring method for measuring an electric characteristic of the circuit under test according to the first aspect described above, including: controlling each of the gate voltage control sections to apply the gate voltage for controlling the corresponding transistor under measurement to be ON, to the gate terminal of the corresponding transistor under measurement; and calculating a threshold voltage of each of the transistors under measurement, based on the gate voltage of the transistor under measurement and the source voltage of the transistor under measurement output from the output section.

According to one exemplary measuring method according to a twelfth aspect related to the innovation included herein, there is provided a measuring method for measuring an electric characteristic of the circuit under test according to the first aspect described above, including: controlling each of the switching transistors to sequentially apply the gate voltage for turning the corresponding transistor under measurement ON and the gate voltage for turning the transistor under measurement OFF to the transistor under measurement; and measuring the source voltage of each of the transistors under measurement when it is turned ON and the source voltage of the transistor under measurement when a predetermined time passes after it is switched from ON to OFF, and calculating a leak current in the PN junction based on an amount of change in the source voltage.

According to one exemplary measuring method according to a thirteenth aspect related to the innovation included herein, there is provided a measuring method for measuring a characteristic of the circuit under test according to the sixth aspect described above, including: controlling the gate voltage control sections to apply a predetermined gate voltage to the gate terminals of the transistors under measurement and controlling the voltage applying sections to control an electric field applied to the gate insulating films of the transistors under measurement to be generally constant; and calculating a gate leak current of each of the transistors under measurement based on an amount of change in the voltage output from the output section during a predetermined period.

Note that the above summary of the invention is not the listing of all necessary features of the present invention, but sub-combinations of these features can also provide an invention.

DESCRIPTION OF EXEMPLARY EMBODIMENTS

One aspect of the present invention will be explained below through embodiments of the invention, but the embodiments below are not intended to limit the invention set forth in the claims or all the combinations of the features explained in the embodiments are not necessarily essential to the means of solving provided by the invention.

Figure 1:
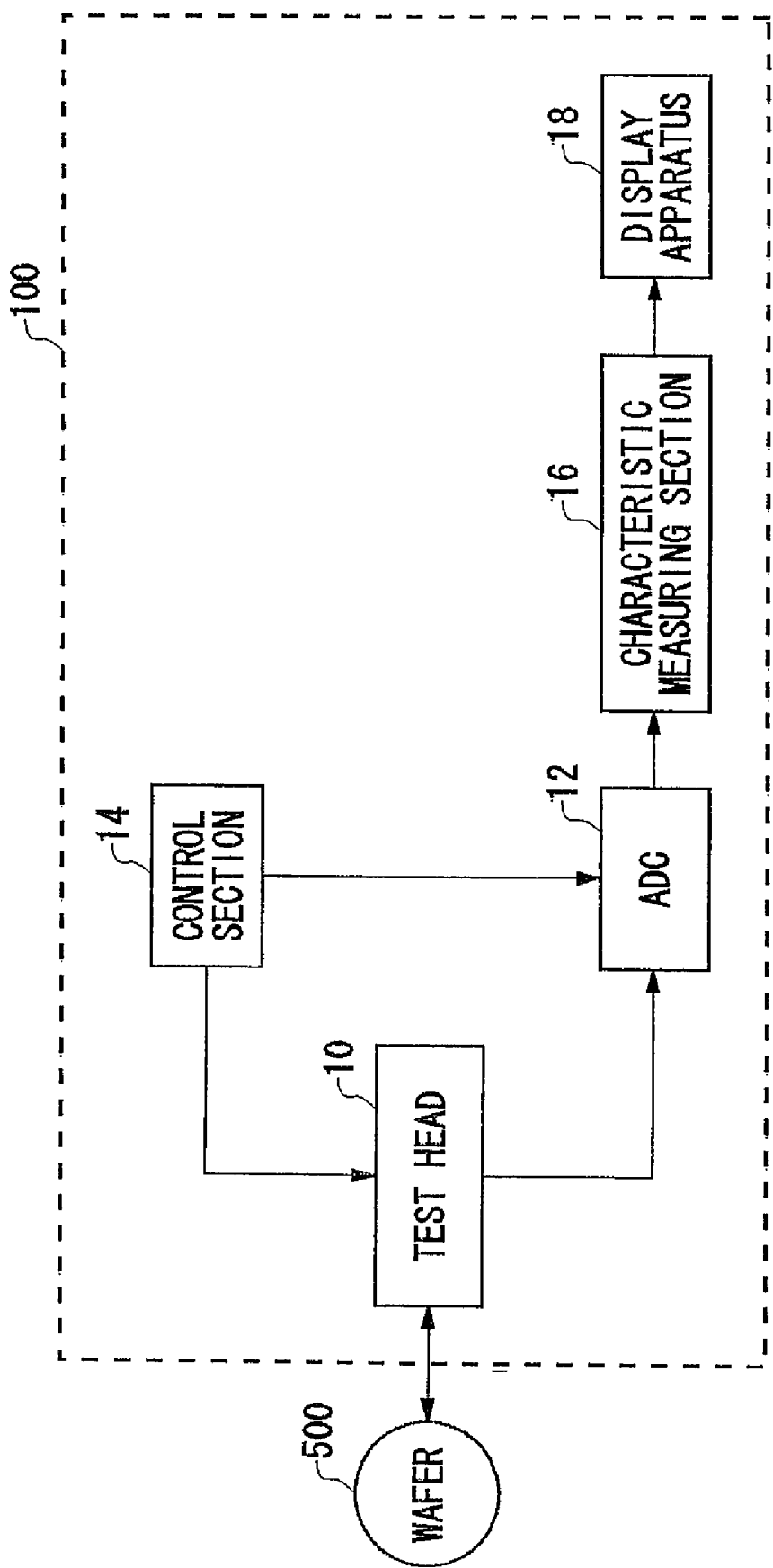
FIG. 1 is a diagram showing the configuration of a measuring apparatus 100 according to an embodiment of the present invention.

FIG. 1 is a diagram showing the configuration of a measuring apparatus 100 according to an embodiment of the present invention. The measuring apparatus 100 is an apparatus for measuring electric characteristics of a wafer 500 on which a plurality of electronic devices are formed, and comprises a test head 10, an ADC 12, a control section 14, a characteristic measuring section 16, and a display apparatus 18.

The test head 10 is electrically connected to a circuit under test provided on the wafer 500, for exchanging signals with the circuit under test. The control section 14 controls the circuit under test on the wafer 500 via the test head 10. The ADC 12 converts a signal output from the circuit under test on the wafer 500 through the test head 10 into digital data.

The characteristic measuring section 16 measures electric characteristics of the circuit under test on the wafer 500 based on the digital data output from the ADC 12. For example, the characteristic measuring section 16 measures the threshold voltage, current-voltage characteristic, leak current, etc. of each transistor under test included in the circuit under test.

The display apparatus 18 displays the electric characteristics of each transistor under test. For example, the display apparatus 18 displays characteristic information corresponding to the voltage value of the threshold voltage of each transistor under test, at the coordinates on the display surface of the display apparatus 18 that correspond to that transistor under test.

Figure 2:
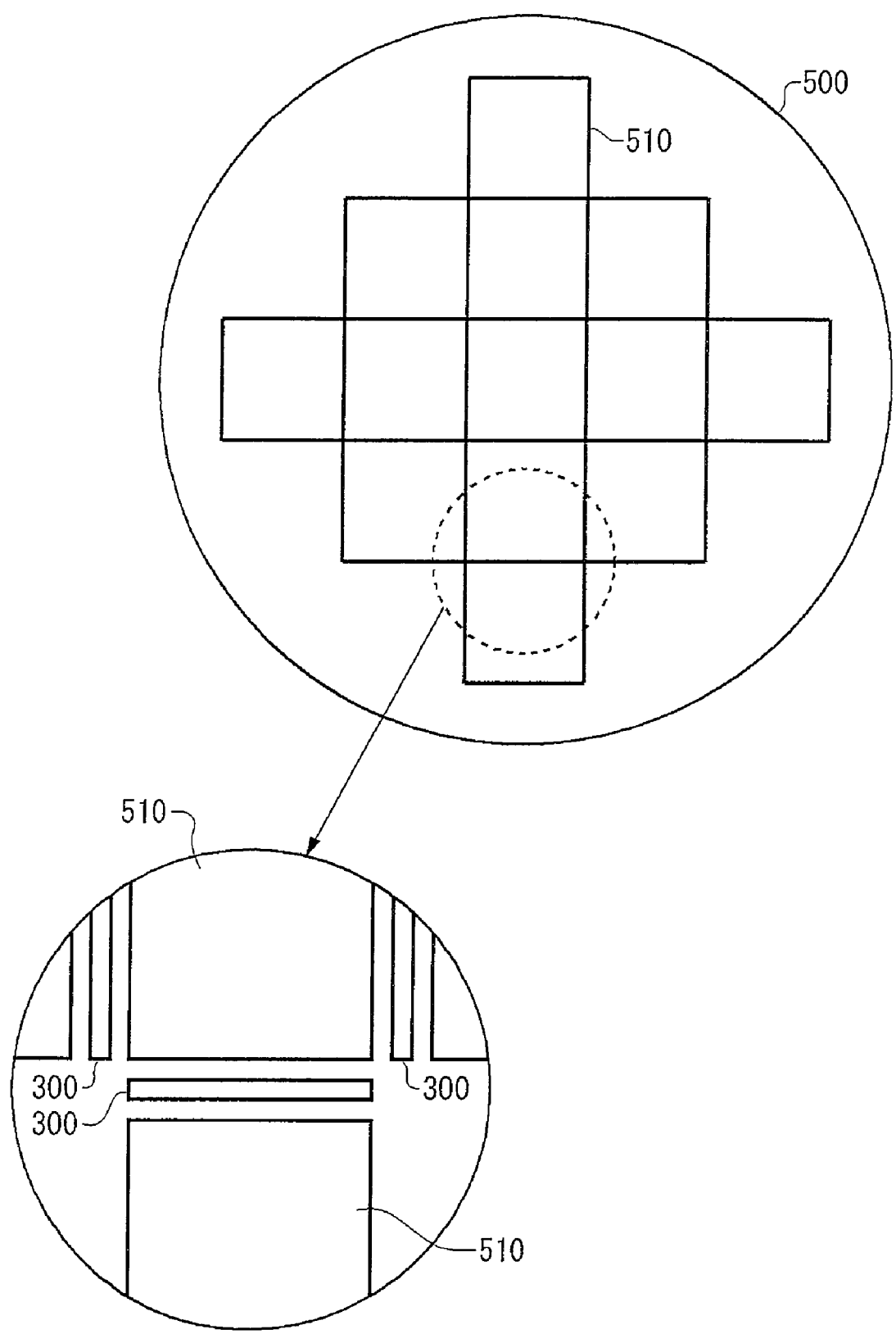
FIG. 2 is a diagram showing one example of the surface of a wafer 500.

FIG. 2 is a diagram showing one example of the surface of the wafer 500. A plurality of electronic devices 510 and circuits under test 300 are formed on the surface of the wafer 500. The electronic devices 510 are the devices which are to be shipped as devices for actual operation. The circuit under test 300 may be provided for each electronic device 510 inside the electronic device 510. In another example, a plurality of circuits under test 300 may only be formed on the surface of the wafer 500. In yet another example, the circuits under test 300 may be provided on the boundary between the respective electronic devices 510 as shown in FIG. 2.

Figure 3:
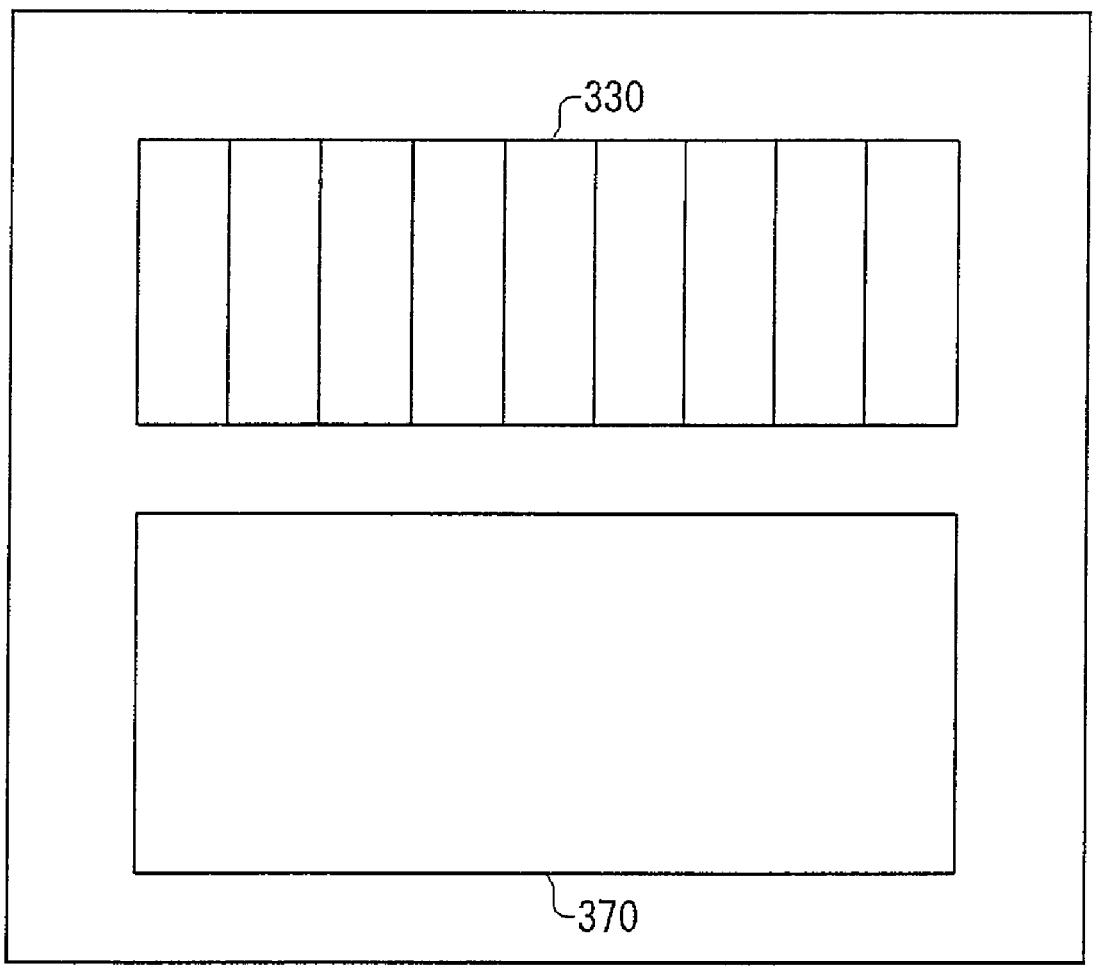
FIG. 3 is a diagram showing one example of the circuit layout of a circuit under test 300.

FIG. 3 is a diagram showing one example of the circuit layout of the circuit under test 300. The circuit under test 300 has a region 330 on which a plurality of transistors under measurement formed with the same or a plurality of process rule(s) and device size(s) are provided, and a gate leak current measuring region 370. In a case where transistors under measurement which are of a plurality of process rules and device sizes are to be provided on the region 330, the region 330 is separated horizontally into a plurality of regions, and each separate region is provided with a transistor under measurement that is of a different process rule and device size from those of the transistors on the other separate regions.

Figure 4:
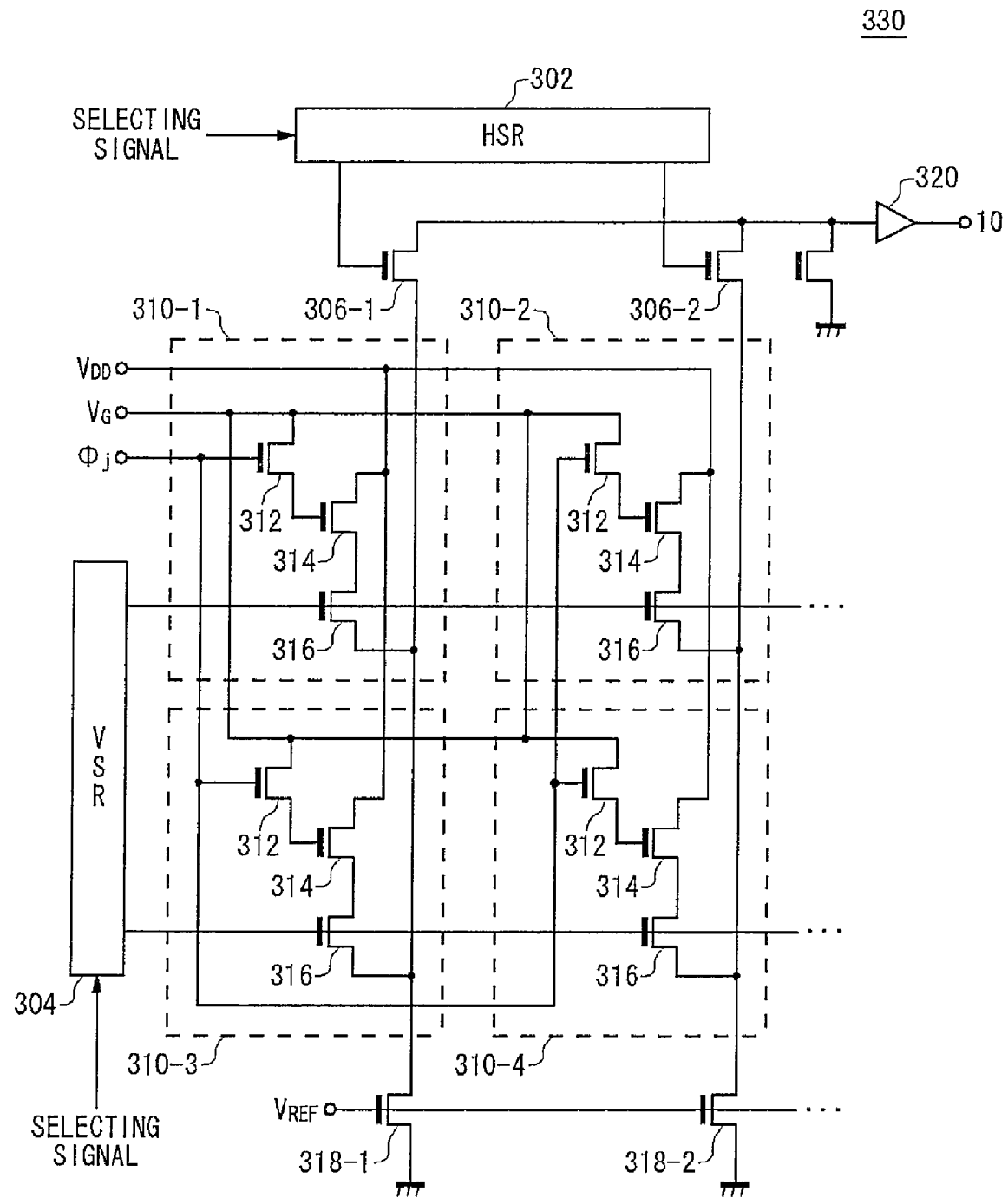
FIG. 4 is a diagram showing one example of the circuit configuration in a region 330.

FIG. 4 is a diagram showing one example of the circuit configuration of the region 330. In the region 330, the circuit under test 300 comprises a row-direction selecting section 302, a column-direction selecting section 304, a plurality of row-direction selecting transistors (306-1 and 306-2, hereinafter collectively referred to as 306), a plurality of current sources (318-1 and 318-2, hereinafter collectively referred to as 318), an output section 320, and a plurality of cells (310-1 to 310-4, hereinafter collectively referred to as 310). The row-direction selecting transistor 306 and current source 318 are provided for each of groups of cells 310, which groups are formed in the row direction.

The plurality of cells 310 are provided in parallel connection within the surface of the wafer 500, along the row direction and column direction to form a matrix of rows and columns. Though the present example shows a circuit in which two cells 310 are provided in the row direction and in the column direction each, but more cells 310 may be formed in the row direction and in the column direction each. Further, the plurality of cells 310 are formed all across the plurality of separate regions explained with reference to FIG. 3. For example, each separate region has cells 310 of 128 columns in the row direction and 512 rows in the column direction. In this case, the process rule and device size of the elements included in the cells 310 vary from a separate region to a separate region.

Each cell 310 comprises a transistor under measurement 314, a switching transistor 312, and a column-direction selecting transistor 316. The transistors of each cell 310 may be MOS transistors which are formed through the same process as that of actual operation transistors comprised in the electronic device 510.

The transistors under measurement 314 in the respective cells 310 are provided in parallel electrical connection with one another. The source terminal of each transistor under measurement 314 is supplied with a predetermined voltage $V_{DD}$. Though a terminal of the transistor under measurement 314 that is to be supplied with a well voltage is not shown, the well voltage terminal may be connected to a ground potential, or the well voltage terminal and source terminal of the transistor under measurement 314 may be connected with the well voltage placed under independent control for each transistor. Further, the transistor under measurement 314 may be either an NMOS transistor or a PMOS transistor. The voltage $V_{DD}$, the voltage $V_G$, the voltage $\phi_j$, and the voltage $V_{REF}$ shown in FIG. 4 may be supplied by the control section 14 shown in FIG. 1 to the circuit under test 300.

The switching transistor 312 of each cell 310 is provided correspondingly to the transistor under measurement 314 of the cell 310, and functions as a gate voltage control section, which applies a predetermined gate voltage to the gate terminal of the corresponding transistor under measurement 314. In the present example, the switching transistor 312 has its source terminal supplied with the predetermined voltage $V_G$, its gate terminal supplied with the voltage $\phi_j$ for controlling the operation of the switching transistor 312, and its drain terminal connected to the gate terminal of the transistor under measurement 314. That is, the switching transistor 312 applies a voltage generally equal to the voltage $V_G$ to the gate terminal of the transistor under measurement 314 when it is controlled to be turned ON by the voltage $\phi_j$, and applies a floating voltage whose initial voltage is generally $V_G$ to the gate terminal of the transistor under measurement 314 when controlled to be turned OFF.

FIG. 4 shows an example where the voltage $\phi_j$ is applied to all the cells 310 simultaneously. In another example, in order that a leak period in measuring a PN junction leak current may be the same in all the cells, the voltage $\phi_j$ may be applied as pulse signals sequentially to the respective rows of cells 310 that run from the column-direction selecting section 304.

The column-direction selecting transistor 316 of each cell 310 is provided correspondingly to the transistor under measurement of that cell. In the present example, the source terminal of each column-direction selecting transistor 316 is connected to the drain terminal of the transistor under measurement 314. The drain terminal of the column-direction selecting transistor 316 is connected to the drain terminal of the corresponding row-direction selecting transistor 306. That is, each row-direction selecting transistor 306 has its drain terminal connected to the drain terminals of a plurality of column-direction selecting transistors 316 which correspond thereto.

The column-direction selecting section 304 sequentially selects plural groups of cells 310 arranged in the column direction (in the present example, the cell group (310-1, 310-2) and the cell group (310-3, 310-4)). The row-direction selecting section 302 sequentially selects plural groups of cells 310 arranged in the row direction (in the present example, the cell group (310-1, 310-3) and the cell group (310-2, 310-4)). With this configuration, the column-direction selecting section 304 and the row-direction selecting section 302 sequentially select the respective cells 310.

In the present example, the column-direction selecting section 304 controls the column-direction selecting transistors 316 provided in the respective cell groups in the column-direction to be turned ON sequentially, from those corresponding to one position in the column direction that corresponds to a selecting signal supplied from the control section 14 to those corresponding to another position in the column direction. The row-direction selecting section 302 controls the row-direction selecting transistors 306 provided correspondingly to the respective cell groups in the row direction to be turned ON sequentially, from that that corresponds to one position in the row direction that corresponds to a selecting signal supplied from the control section 14 to that that corresponds to another position in the row direction. The control section 14 supplies a selecting signal for sequentially selecting the respective cells 310 to the column-direction selecting section 304 and the row-direction selecting section 302. The row-direction selecting section 302 and the column-direction selecting section 304 may be a circuit such as a decoder, a shift register, etc. which converts the supplied selecting signal into a position signal indicating the position of the cell 310 that should be selected. Here, a position signal is a signal which controls the row-direction selecting transistor 306 and column-direction selecting transistor 316, which correspond to the cell 310 that should be selected in accordance with the selecting signal, to be turned ON.

With this configuration, the transistors under measurement 314 provided in the respective cells 310 are sequentially selected. Then, the source voltages of the transistors under measurement 314 selected in the sequential manner are supplied to the output section 320 sequentially. The output section 320 sequentially outputs supplied source voltages to the test head 10. The output section 320 is, for example, a voltage-follower buffer. The measuring apparatus 100 measures electric characteristics of each transistor under measurement 314 such as threshold voltage, current-voltage characteristic, low-frequency noise, PN junction leak current, etc., based on the source voltage of the transistor under measurement 314.

Each current source 318 is a MOS transistor which receives the predetermined voltage $V_{REF}$ at its gate terminal. Each current source 318 has its source terminal connected to the drain terminals of a plurality of column-direction selecting transistors 316 which correspond thereto. That is, each current source 318 is provided in common for a plurality of transistors under measurement 314 which are provided at generally the same position in the row direction, and defines the source-drain current flowing through the corresponding transistors under measurement 314.

Since the circuit configuration shown in FIG. 3 enables the plurality of transistors under measurement 314 in each circuit under test 300 to be sequentially electrically selected, and the source voltages of the selected transistors under measurement 314 to be sequentially output, the source voltages of the respective transistors under measurement 314 can be measured quickly in a short time. Therefore, even in a case where many transistors under measurement 314 are provided on the wafer 500, all the transistors under measurement 314 can be measured in a short time. In the present example, about 10,000 to 10,000,000 transistors under measurement 314 may be provided within the surface of the wafer 500. By conducting measurement on many transistors under measurement 314, it is possible to accurately calculate any unevenness in the characteristics of the transistors under measurement 314.

Figure 5:
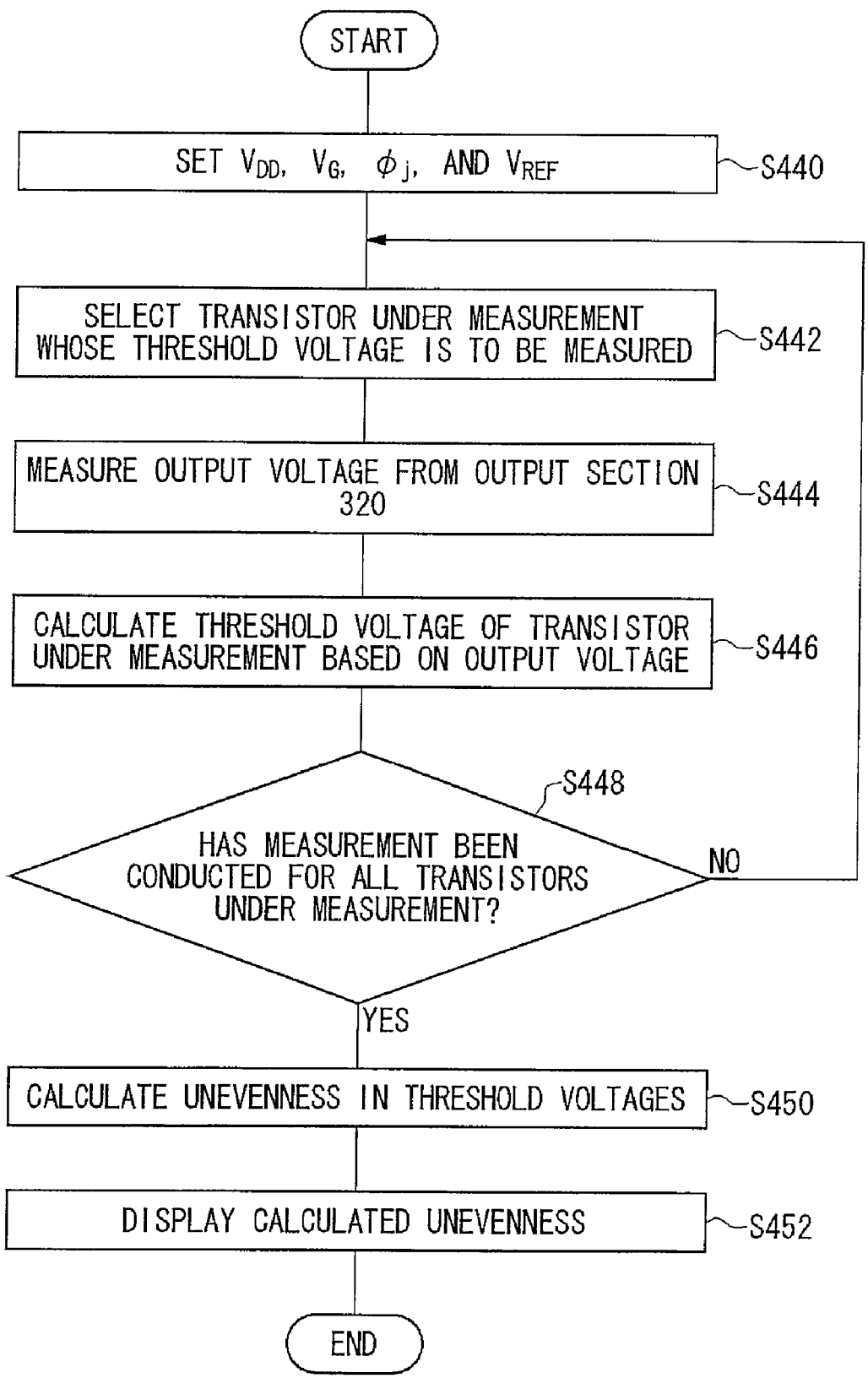
FIG. 5 is a flowchart showing one example of the operation of the measuring apparatus 100 in a case where the measuring apparatus 100 measures threshold voltage of each transistor under measurement 314.

FIG. 5 is a flowchart showing one example of the operation of the measuring apparatus 100 in a case where the measuring apparatus 100 is to measure the threshold voltage of each transistor under measurement 314. First, the control section 14 supplies the voltage $V_{DD}$, the voltage $V_G$, the voltage $\phi_j$, and the voltage $V_{REF}$ explained with reference to FIG. 4 to the circuit under test 300 (S440). At this time, the control section 14 supplies a constant voltage $V_{REF}$ to the respective current sources 318, thereby functioning as a current control section which makes the respective current sources 318 generate the same constant current. Further, the control section 14 supplies the gate voltage $V_G$ for controlling the transistor under measurement 314 to be turned ON, and the voltage $\phi_j$ for controlling each switching transistor 312 to be turned ON. By such control, the control section 14 functions as a gate control section which applies a gate voltage for controlling each transistor under measurement 314 to be turned ON, to the gate terminal of the transistor under measurement 314.

Next, the control section 14 supplies a selecting signal for selecting the transistor under measurement 314 whose threshold voltage should be measured to the row-direction selecting section 302 and the column-direction selecting section 304 (S442). Then, the ADC 12 measures an output voltage from the output section 320 (S444). The ADC 12 may notify to the control section 14 that it has measured this output voltage. The control section 14 may select the next transistor under measurement 314 when it receives this notification.

Next, the characteristic measuring section 16 calculates the threshold voltage of each transistor under measurement 314, based on the gate voltage $V_G$ applied to that transistor under measurement 314 and the output voltage from the output section 320 (S446). It is possible to obtain the threshold voltage of the transistor under measurement 314, by calculating, for example, the difference between the gate voltage $V_G$ and the output voltage, i.e., the gate-source voltage of the transistor under measurement 314.

Next, the control section 14 judges whether or not the measurement of the threshold voltage has been conducted on all the transistors under measurement 314 (S448). In a case where there is any transistor under measurement 314 that has not yet been measured, the control section 14 selects the next transistor under measurement 314 so that the processes of S444 and S446 are repeated therefor. In a case where the measurement of the threshold voltage has been conducted for all the transistors under measurement 314, the characteristic measuring section 16 calculates unevenness in the threshold voltages (S450). Then, the display apparatus 18 displays the unevenness in the threshold voltages calculated by the characteristic measuring section 16 (S452).

By this operation, it is possible to efficiently measure unevenness in the threshold voltages of the plurality of transistors under measurement 314. Further, it is possible to measure unevenness in the threshold voltages of the transistors under measurement 314 for each process rule separately. Furthermore, by conducting the measurement for the plurality of circuits under test 300 provided on the wafer 500, it is possible to measure the distribution of threshold voltage unevenness on the surface of the wafer 500.

Figure 6:
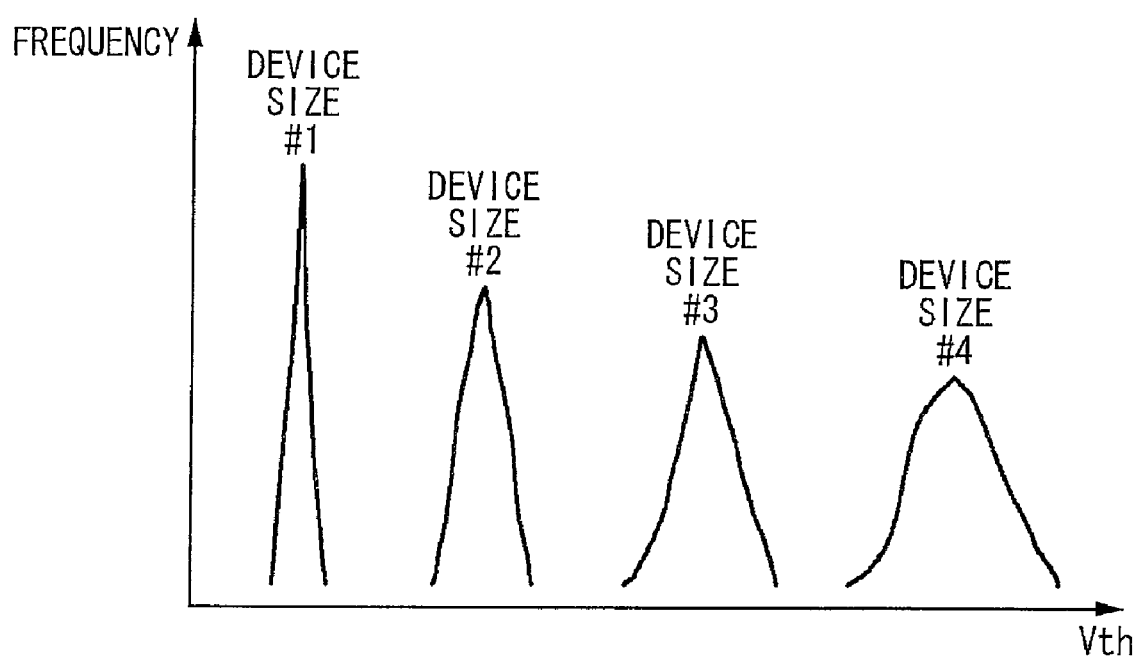
FIG. 6 is a diagram showing one example of unevenness in threshold voltages of transistors under measurement 314.

FIG. 6 is a diagram showing one example of unevenness in the threshold voltages of the transistors under measurement 314. In FIG. 6, the horizontal axis represents the threshold voltage, and the vertical axis represents the frequency at which each threshold voltage appears. Further, FIG. 6 shows the distribution of threshold voltages for each device size of the transistors under measurement 314 separately. Transistors under measurement 314 having different device sizes have different gate lengths, etc., so their threshold voltages vary. Therefore, the distributions of threshold voltage of the respective device sizes have different peak values from one another.

Since the measuring apparatus 100 can accurately measure unevenness in the threshold voltages of the transistors under measurement 314 formed with each device size as shown in FIG. 6, it is possible to reduce design margins when designing circuits for actual operation with each device size. Hence, it is possible to improve the area efficiency of the circuits for actual operation, and reduce design costs.

Further, in a case where the circuit under test 300 is provided in each electronic device 510, which is the circuit for actual operation, it is possible to estimate unevenness in the characteristics of the actual-operation transistors included in the electronic device 510, by measuring unevenness in the characteristics of the transistors under measurement 314 included in the circuit under test 300. Therefore, it is possible to efficiently judge whether the electronic device 510 is good or defective, based on the unevenness in the characteristics of the transistors under measurement 314.

Figure 7:
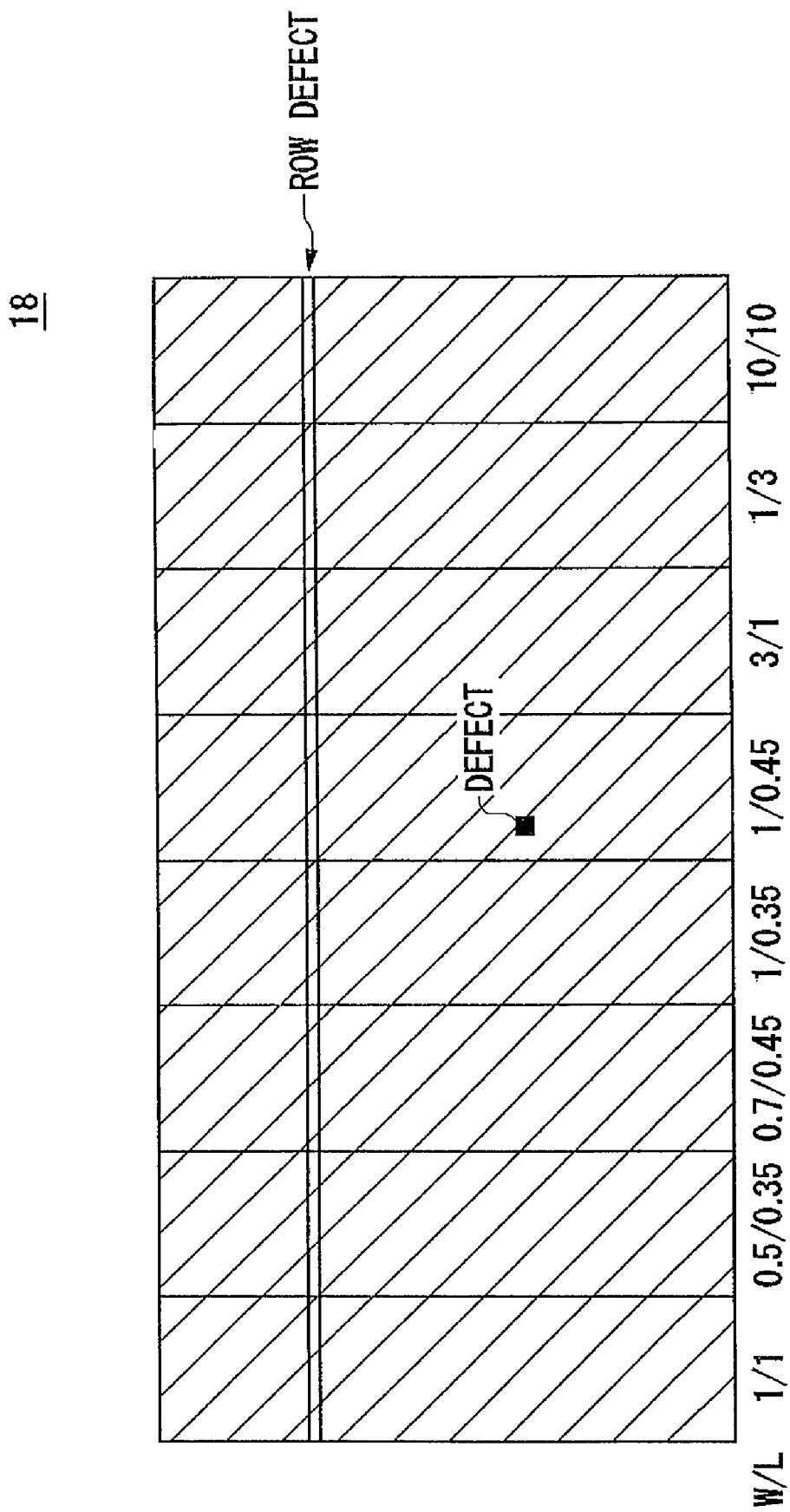
FIG. 7 is a diagram showing unevenness in threshold voltages displayed by a display section of a display apparatus 18.

FIG. 7 is a diagram showing the unevenness in the threshold voltages displayed by a display section of the display apparatus 18. The display apparatus 18 comprises a storage section which stores the threshold voltage of each transistor under measurement 314 measured by the measuring apparatus 100 in association with the position of the transistor under measurement 314 within the surface of the wafer 500, and the display section which displays unevenness in the threshold voltages. The storage section may receive a threshold voltage from the characteristic measuring section 16, and position information of the transistor under measurement 314 corresponding to that threshold voltage from the control section 14. The control section 14 may supply a selecting signal to be supplied to the circuit under test 300 to the storage section as the position information of the transistor under measurement 314.

As shown in FIG. 7, the display section displays the region 330 explained with reference to FIG. 3. Further, the display section displays characteristic information corresponding to the voltage value of the threshold voltage of each transistor under measurement 314, at coordinates corresponding to the position of the transistor under measurement 314 on its display surface, which corresponds to a surface portion of the wafer 500.

Here, the characteristic information may be displayed as a dot having brightness corresponding to the voltage value of the threshold voltage of each transistor under measurement 314, at the coordinates on the display surface that correspond to the transistor under measurement 314. Alternately, the characteristic information may be displayed as a dot having a hue corresponding to the voltage value of the threshold voltage of each transistor under measurement 314, at the coordinates on the display surface that correspond to the transistor under measurement 314.

By displaying the unevenness in the threshold voltages of the transistors under measurement 314 correspondingly to the positions of the respective transistors under measurement 314 in this manner, it is possible to visualize the distribution of the unevenness in the threshold voltages in the circuit. This enables easy spotting of any row defects, point defects, etc.

Figure 8:
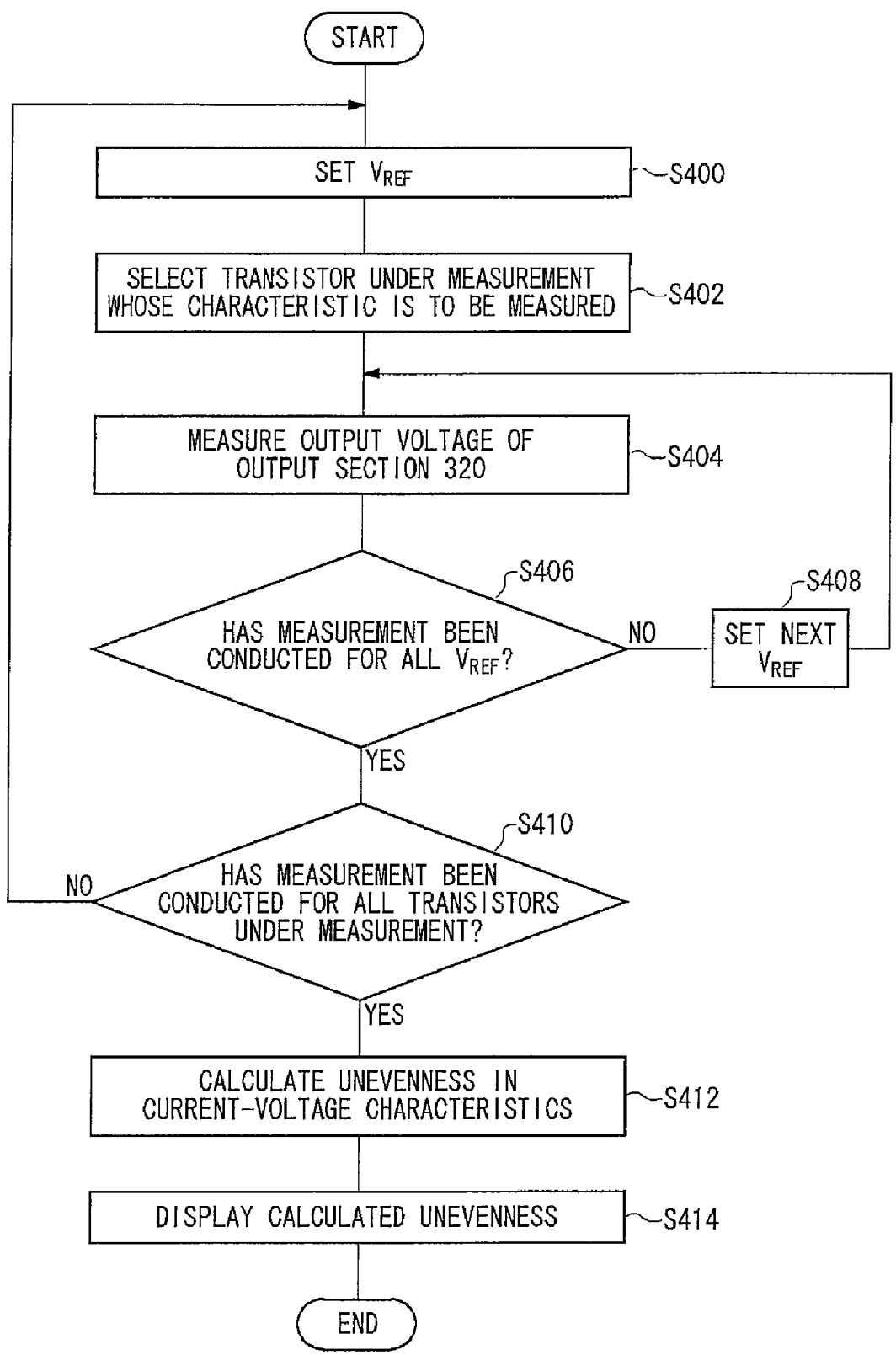
FIG. 8 is a flowchart showing one example of the operation of the measuring apparatus 100 in a case where the measuring apparatus 100 measures current-voltage characteristic of each transistor under measurement 314.

FIG. 8 is a flowchart showing one example of the operation of the measuring apparatus 100 in a case where the measuring apparatus 100 measures the current-voltage characteristic of each transistor under measurement 314. First, the control section 14 supplies the voltage $V_{DD}$, the voltage $V_G$, the voltage $\phi_j$, and the voltage $V_{REF}$ explained with reference to FIG. 4 to the circuit under test 300 (S400). At this time, the control section 14 supplies a constant voltage $V_{REF}$ to the respective current sources 318 to make the respective current sources 318 generate the same constant current. Further, the control section 14 supplies the gate voltage $V_G$ for controlling the transistor under measurement 314 to be turned ON, and the voltage $\phi_j$ for controlling each switching transistor 312 to be turned ON.

Next, the control section 14 supplies a selecting signal for selecting the transistor under measurement 314 whose current-voltage characteristic should be measured to the row-direction selecting section 302 and the column-direction selecting section 304 (S402). Then, the control section 14 changes the $V_{REF}$ at a predetermined resolution within a predetermined range (S406 to S408). At this time, the ADC 12 measures an output voltage from the output section 320 at each $V_{REF}$ (S404). That is, the measuring apparatus 100 sequentially changes the source-drain current generated by the current source 318, and measures the source voltage of the transistor under measurement 314 at each source-drain current level. Thereby, the current-voltage characteristic of the transistor under measurement 314 can be measured.

Then, the control section 14 judges whether or not the measurement of the current-voltage characteristic has been conducted for all the transistors under measurement 314 (S410). In a case where there is any transistor under measurement 314 that has not been measured, the processes of S400 to S410 are repeated. At this time, the next transistor under measurement 314 is selected at S402.

In a case where the measurement of the current-voltage characteristic has been conducted for all the transistors under measurement 314, the characteristic measuring section 16 calculates unevenness in the current-voltage characteristics (S412). For example, the characteristic measuring section 16 calculates the mutual conductance gin of each current-voltage characteristic, and calculates unevenness in the mutual conductance gm. Further, the characteristic measuring section 16 calculates inclination swing and silicon gate insulating film interface state density from the current-voltage characteristic of a sub-threshold region, and calculates unevenness in them. Then, the display apparatus 18 displays the unevenness in the characteristics calculated by the characteristic measuring section 16 (S414). The operation of the display apparatus 18 is similar to the case explained with reference to FIG. 7. In FIG. 7, the characteristic information corresponding to the voltage value of the threshold voltage is displayed, whereas the display apparatus 18 of the present example displays characteristic information corresponding to the mutual conductance gm, etc. of the current-voltage characteristic. With this operation, it is possible to grasp unevenness in the current-voltage characteristics easily.

Figure 9:
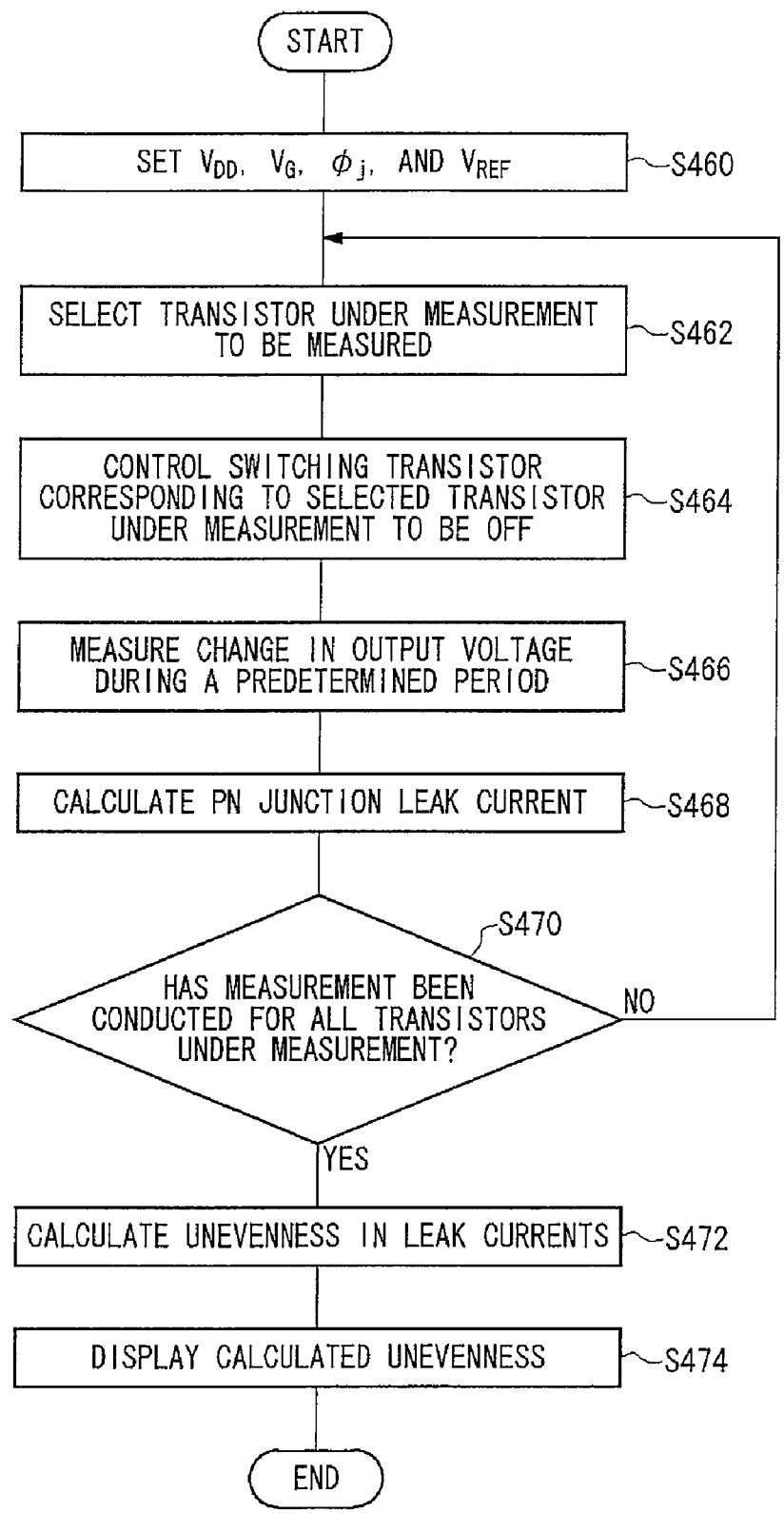
FIG. 9 is a flowchart showing one example of the operation of the measuring apparatus 100 in a case where the measuring apparatus 100 measures PN junction leak current of each cell 310.

FIG. 9 is a flowchart showing one example of the operation of the measuring apparatus 100 in a case where it measures PN junction leak current of each cell 310. Each switching transistor 312 comprises a PN junction which is connected to the gate terminal of the corresponding transistor under measurement 314. In the present example, a leak current in this PN junction is measured.

First, the control section 14 supplies the voltage $V_{DD}$, the voltage $V_G$, the voltage $\phi_j$, and the voltage $V_{REF}$ explained with reference to FIG. 4 to the circuit under test 300 (S460). At this time, the control section 14 supplies a constant voltage $V_{REF}$ to the respective current sources 318 to make the respective current sources 318 generate the same constant current. Further, the control section 14 supplies the gate voltage $V_G$ for controlling the transistor under measurement 314 to be turned ON, and the voltage $\phi_j$ for controlling each switching transistor 312 to be turned ON. By supplying pulse signals sequentially to the respective rows of cells 310 that run from the column-direction selecting section 304, it is possible to make the leak current measuring period the same in all the cells 310.

Next, the control section 14 supplies a selecting signal for selecting the transistor under measurement 314 whose PN leak current should be measured to the row-direction selecting section 302 and the column-direction selecting section 304 (S462). Then, the control section 14 controls the switching transistor 312 corresponding to the selected transistor under measurement 314 to be turned OFF (S464). That is, the control section 14 controls each switching transistor 312 to sequentially apply a gate voltage for turning ON the corresponding transistor under measurement 314 and a gate voltage for turning OFF the transistor under measurement 314, to the transistor under measurement 314.

Next, the characteristic measuring section 16 measures the source voltage of the transistor under measurement 314 when it is turned ON, and the source voltage of the transistor under measurement 314 when a predetermined period passes after it is switched from ON to OFF (S466). In the present example, the characteristic measuring section 16 measures changes in the output voltage from the output section 320 during this predetermined period.

Next, the characteristic measuring section 16 calculates leak current in the PN junction based on the changes in the source voltage (S468). When the switching transistor 312 is ON, the gate capacity of the transistor under measurement 314 stores charges corresponding to the gate voltage. Then, when the switching transistor 312 is switched to OFF, a leak current in the PN junction discharges the charges from the gate capacity. Hence, the level of the PN junction leak current is determined by the amount of change in the source voltage of the transistor under measurement 314 during the predetermined period.

Next, the control section 14 judges whether or not the measurement of PN junction leak current has been conducted for all the transistors under measurement 314 (S470). In a case where there is any transistor under measurement 314 that has not yet been measured, the processes of S462 to S470 are repeated. At this time, the next transistor under measurement 314 is selected at S462.

In a case where the measurement of PN junction leak current has been conducted for all the transistors under measurement 314, the characteristic measuring section 16 calculates unevenness in the PN junction leak currents (S472). Then, the display apparatus 18 displays the unevenness in the characteristics calculated by the characteristic measuring section 16 (S474). The operation of the display apparatus 18 is similar to the case explained with reference to FIG. 7. In FIG. 7, the characteristic information corresponding to the voltage value of the threshold voltage is displayed, whereas the display apparatus 18 in the present example displays characteristic information corresponding to the current value of the PN junction leak current. With this operation, it is possible to easily grasp the unevenness in the PN junction leak currents.

Figure 10:
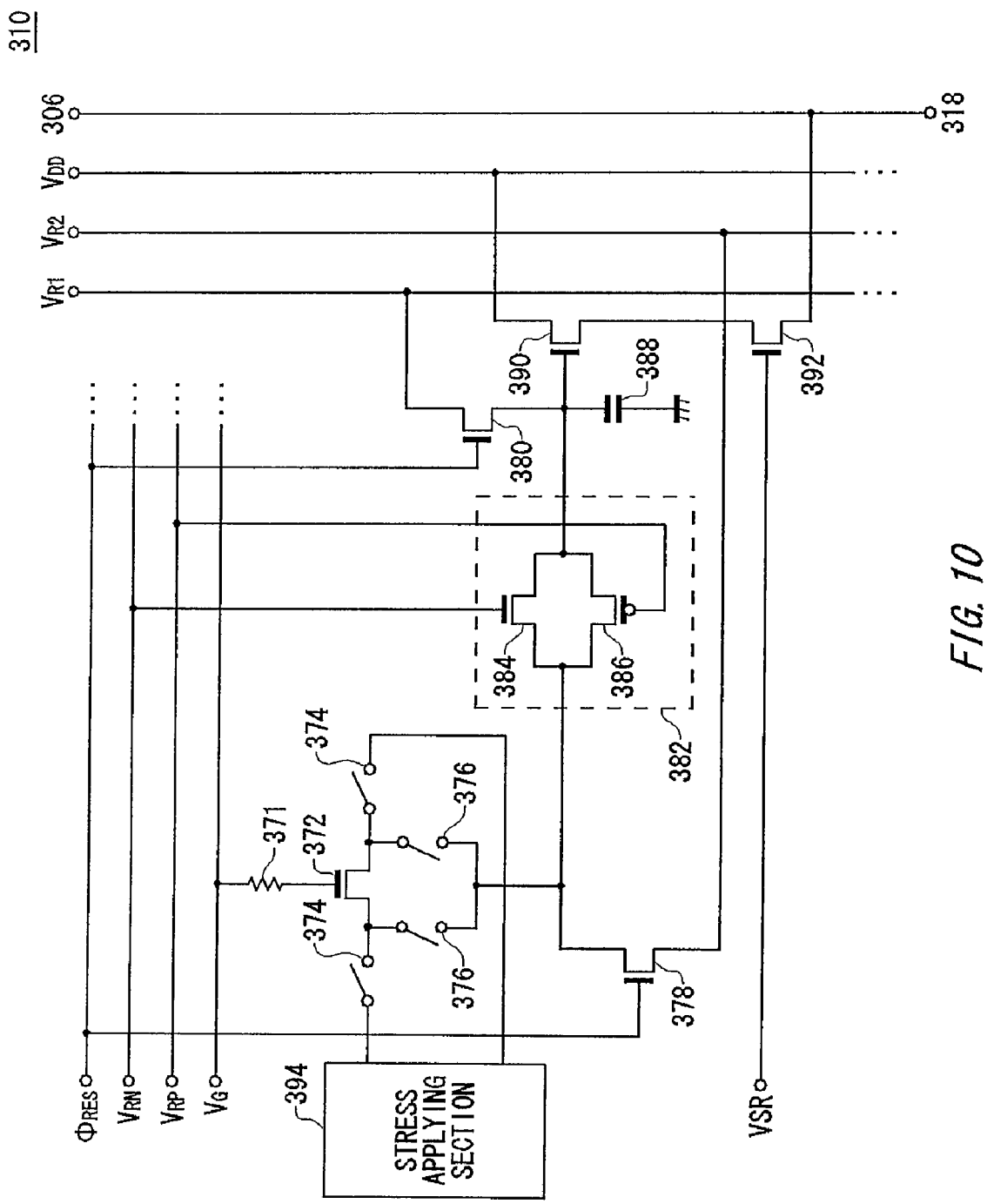
FIG. 10 is a diagram showing one example of the circuit configuration of one cell 310 arranged in a gate leak current measuring region 370.

FIG. 10 is a diagram showing one example of the circuit configuration of one cell 310 which is arranged in the gate leak current measuring region 370. The circuit of the present example charges or discharges an integral capacitor 388, by a gate leak current of the transistor under measurement 372 that is obtained by applying an electrical stress to the transistor under measurement 372 to apply a constant electric field to the gate insulating film of the transistor under measurement 372. Then, the measuring apparatus 100 calculates the gate leak current of each transistor under measurement 372 based on changes in the voltage value of the integral capacitor 388 during a predetermined period.

The circuit configuration of the gate leak current measuring region 370 has a different configuration of the cells 310 from that in the circuit configuration of the region 330. In FIG. 10, the configuration of each cell 310 in the gate leak current measuring region 370 is shown, but a row-direction selecting section 302, a column-direction selecting section 304, a plurality of row-direction selecting transistors (306-1 and 306-2, hereinafter collectively referred to as 306), a plurality of current sources (318-1 and 318-2, hereinafter collectively referred to as 318), and an output section 320 are omitted because they are the same as in FIG. 4.

Each cell 310 comprises a stress applying section 394, a transistor under measurement 372, a gate voltage control section 371, first switches 374, second switches 376, a voltage applying section 382, the integral capacitor 388, a column-direction selecting transistor 392, resetting transistors 378 and 380, and an outputting transistor 390.

The stress applying section 394 applies an electrical stress to the gate insulating film of the transistor under measurement 372 via the first switches 374. For example, in a case where the transistor under measurement 372 is seen as a storage cell of a flash memory, the stress applying section 394 applies, to the transistor under measurement 372, a voltage for writing data or erasing data.

When the stress applying section 394 is to apply a stress, the first switches 374 connect the source terminal and drain terminal of the transistor under measurement 372 to the stress applying section 394 respectively, and the second switches 376 become OFF. By such control, it is possible to apply a desired voltage to each terminal of the transistor under measurement 372 and apply a stress thereto.

In the present example, the stress applying section 394 applies the following four kinds of stresses to the transistor under measurement 314 independently or sequentially.

(1) FN (Fowler-Nordheim) Gate injection
(2) FN Substrate injection
(3) Hot Electron injection
(4) Source Erase The above (1) to (4) are the means for applying stresses to the transistor under measurement 372 by writing data into the transistor under measurement 372 or erasing data in the transistor under measurement 372. Here, in actual operation, the stress applying section 394 may apply a voltage that should be applied when data is to be written into the transistor under measurement 372 or data in the transistor under measurement 372 is to be erased, to each terminal of the transistor under measurement 372, or may apply a voltage higher than the voltage that should be applied in actual operation, to each terminal of the transistor under measurement 372.

Each cell 310 is supplied with a resetting signal $\phi_{RES}$, control voltages $V_{RN}$, $V_{RP}$, $V_{R1}$, $V_{R2}$, and $V_{DD}$, and a gate voltage $V_G$ from the control section 14. The gate voltage control section 371 applies the predetermined gate voltage $V_G$ supplied from the control section 14 to the gate terminal of the transistor under measurement 372.

The second switches 376 switch between connecting and not connecting the source terminal and drain terminal of the transistor under measurement to the integral capacitor via the voltage applying section 382. The voltage applying section 382 applies a constant voltage to the source terminal and drain terminal of the transistor under measurement 372 via the second switches 376. When the second switches 376 are ON, a voltage generated by the voltage applying section 382 is applied to the source terminal and drain terminal of the transistor under measurement 372. That is, the voltage applying section 382 controls an electric field applied to the gate insulating film of the transistor under measurement 372 to be generally constant, by applying a constant voltage to the source terminal and drain terminal of the transistor under measurement 372.

The voltage applying section 382 comprises an NMOS transistor 384 and a PMOS transistor 386. The NMOS transistor 384 is supplied with the gate voltage $V_{RN}$ corresponding to the voltage that should be applied to the source terminal and drain terminal of the transistor under measurement 372, has its source terminal connected to the source terminal and drain terminal of the transistor under measurement 372 via the second switches 376, and has its drain terminal connected to the integral capacitor 388. The PMOS transistor 386 is provided in parallel connection with the NMOS transistor 384, supplied with the gate voltage $V_{RP}$ corresponding to the voltage that should be applied to the source terminal and drain terminal of the transistor under measurement 372, has its drain terminal connected to the source terminal and drain terminal of the transistor under measurement 372 via the second switches 376, and has its source terminal connected to the integral capacitor 388. The NMOS transistor 384 and PMOS transistor 386 have the function of keeping the voltage, which is to be applied across the gate and source or the gate and drain of the transistor under measurement 372, generally constant, even if the potentials of the NMOS transistor and PMOS transistor change as a gate leak current is integrated by the integral capacitor 388.

With this configuration, it is possible to apply a constant electric field to the gate insulating film of the transistor under measurement 372 regardless of whether the transistor under measurement 372 is P type or N type, and to charge or discharge the integral capacitor 388 by a gate leak current of the transistor under measurement 372.

The integral capacitor 388 is charged or discharged by a gate leak current output from the source terminal and drain terminal of the transistor under measurement 372. That is, the integral capacitor 388 integrates the gate leak current and converts it into a voltage value. The resetting transistors 378 and 380 initialize the voltage value of the integral capacitor 388 to a predetermined voltage $V_{R1}$, when they receive the resetting signal $\phi_{RES}$ at their gate terminals.

The outputting transistor 390 receives the voltage of the integral capacitor 388 at its gate terminal, and outputs its source voltage which corresponds to the received voltage. The column-direction selecting transistor 392 outputs the source voltage of the outputting transistor 390 to the row-direction selecting transistor 306, in response to a signal from the column-direction selecting section (VSR) 304.

Figure 11:
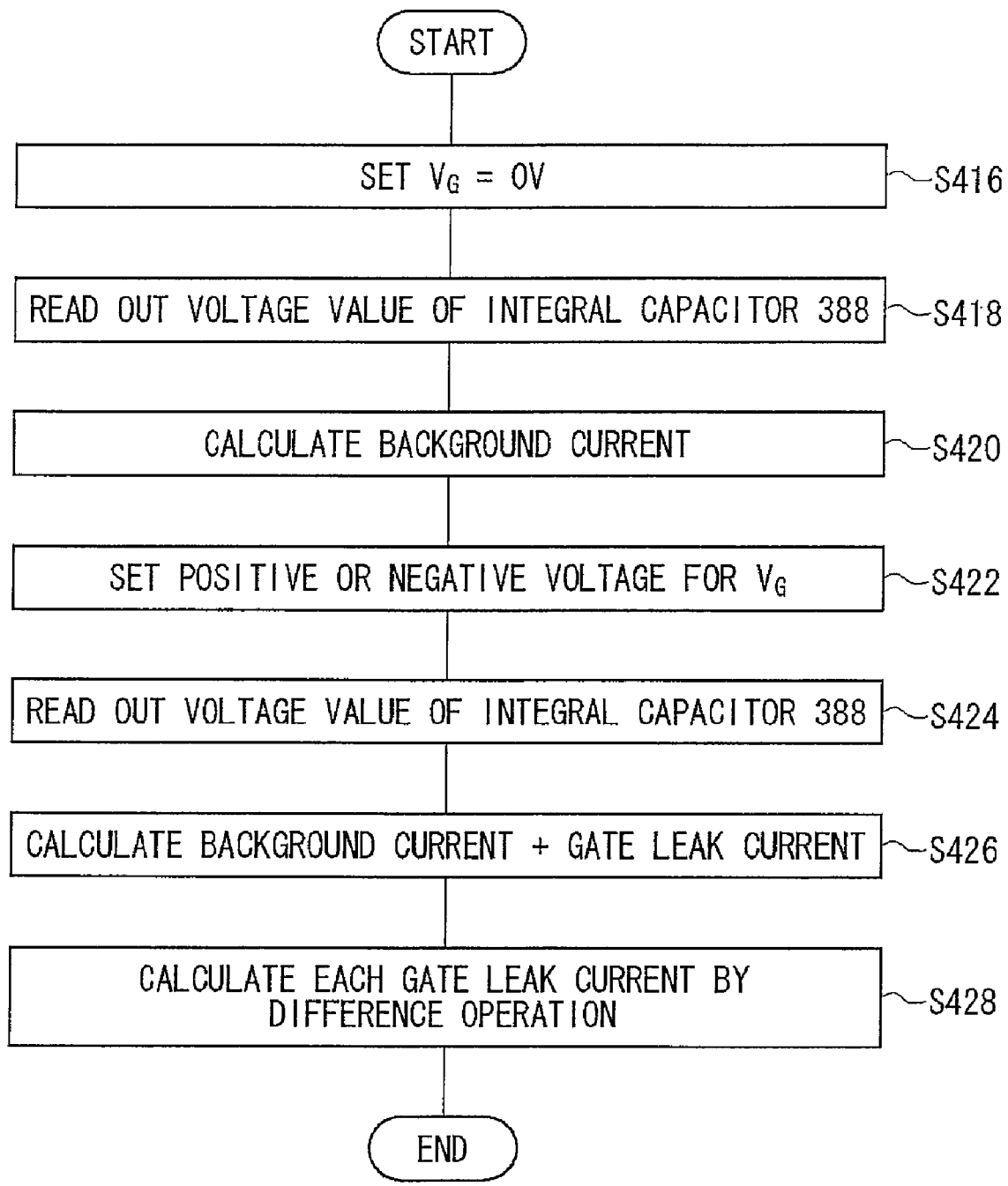
FIG. 11 is a flowchart showing one example of the operation of the measuring apparatus 100 in a case where the measuring apparatus 100 measures gate leak current of a transistor under measurement 372.

FIG. 11 is a flowchart showing one example of the operation of the measuring apparatus 100, in a case where the measuring apparatus 100 measures a gate leak current of the transistor under measurement 372. Before measuring a gate leak current of each transistor under measurement 372, the control section 14 first applies an electric stress to the transistor under measurement 372 of each cell 310.

At this time, the control section 14 controls the first switches 374 to be ON and the second switches 376 to be OFF. Then, the control section 14 controls the stress applying section 394 of each cell 310 to apply a stress to the transistor under measurement 372. Further, the control section 14 may control the stresses (1) to (4) explained with reference to FIG. 10 to be applied to the transistor under measurement 372 independently or sequentially. The control section 14 applies the stress to the transistors under measurement 372 of the respective cells 310 generally at the same time.

After performing the above-described operation, the control section 14 sequentially selects the transistors under measurement 372, and measures the gate leak current of the selected transistors under measurement 372. The operation for selecting the transistors under measurement 372 is the same as the selecting operation explained with reference to FIG. 5 and FIG. 8, and explanation thereof is therefore omitted. In the present example, an operation for measuring the gate leak current of one transistor under measurement 372 will be explained.

First, the control section 14 controls the first switches 374 to be OFF and the second switches 376 to be ON. Then, the control section 14 applies a gate voltage of about 0V to the gate terminal of the transistor under measurement 372 (S416). At this time, no gate leak current occurs in the transistor under measurement 372.

Next, the control section 14 sets the voltage of the integral capacitor 388 to a predetermined initial voltage value. At this time, the control section 14 controls the resetting transistor 380 to set the integral capacitor 388 to the initial voltage $V_{R1}$. The control section 14 makes this setting by supplying the resetting signal $\phi_{RES}$ for controlling the resetting transistors 378 and 380 to be turned ON.

Next, the characteristic measuring section 16 reads changes in the voltage value of the integral capacitor 388 for a predetermined period after the voltage of the integral capacitor 388 is set to the initial voltage value (S418). At this time, the control section 14 controls the row-direction selecting section 302 and the column-direction selecting section 304 to select the cell 310 concerned. Further, the characteristic measuring section 16 receives a voltage output from the output section 320 as the voltage of the integral capacitor 388.

Next, the characteristic measuring section 16 calculates the current value (first current value) of a background current of the cell 310, based on the amount of change in the voltage output from the output section 320 during the predetermined period (S420). At this time, since no gate leak current occurs in the transistor under measurement 372, the integral capacitor 388 is charged or discharged by the background current. Hence, it is possible to measure the background current based on the change in the voltage of the integral capacitor 388 during the predetermined period.

Next, the control section 14 applies a positive or negative gate voltage to the gate terminal of the transistor under measurement 372 (S422). At this time, the control section 14 keeps the voltage applied across the gate and source or the gate and drain of the transistor under measurement 372 generally constant, by controlling the voltages $V_{RN}$ and $V_{RP}$. At this time, a gate leak current corresponding to the gate voltage occurs in the transistor under measurement 372.

Next, the control section 14 sets the voltage of the integral capacitor 388 to a predetermined initial voltage value. Then, the characteristic measuring section 16 reads changes in the voltage value of the integral capacitor 388 during the aforementioned predetermined period after the voltage of the integral capacitor 388 is set to the initial voltage value (S424).

Next, the characteristic measuring section 16 calculates a second current value indicating the sum of the background current and the gate leak current, based on the amount of change in the voltage value of the integral capacitor 388 during the predetermined period (S426). At this time, the integral capacitor 388 is charged or discharged by the current indicating the sum of the background current and the gate leak current. Hence, it is possible to measure the current indicating the sum of the background current and the gate leak current, based on the change in the voltage of the integral capacitor 388 during the predetermined period.

Next, the characteristic measuring section 16 calculates the current value of the gate leak current by subtracting the first current value from the calculated second current value (S428). By this control, it is possible to accurately measure the gate leak current of the transistor under measurement 372 by removing the influence of the background current. Further, since the gate leak current is measured through integration, it is possible to measure a minute gate leak current.

Figure 12:
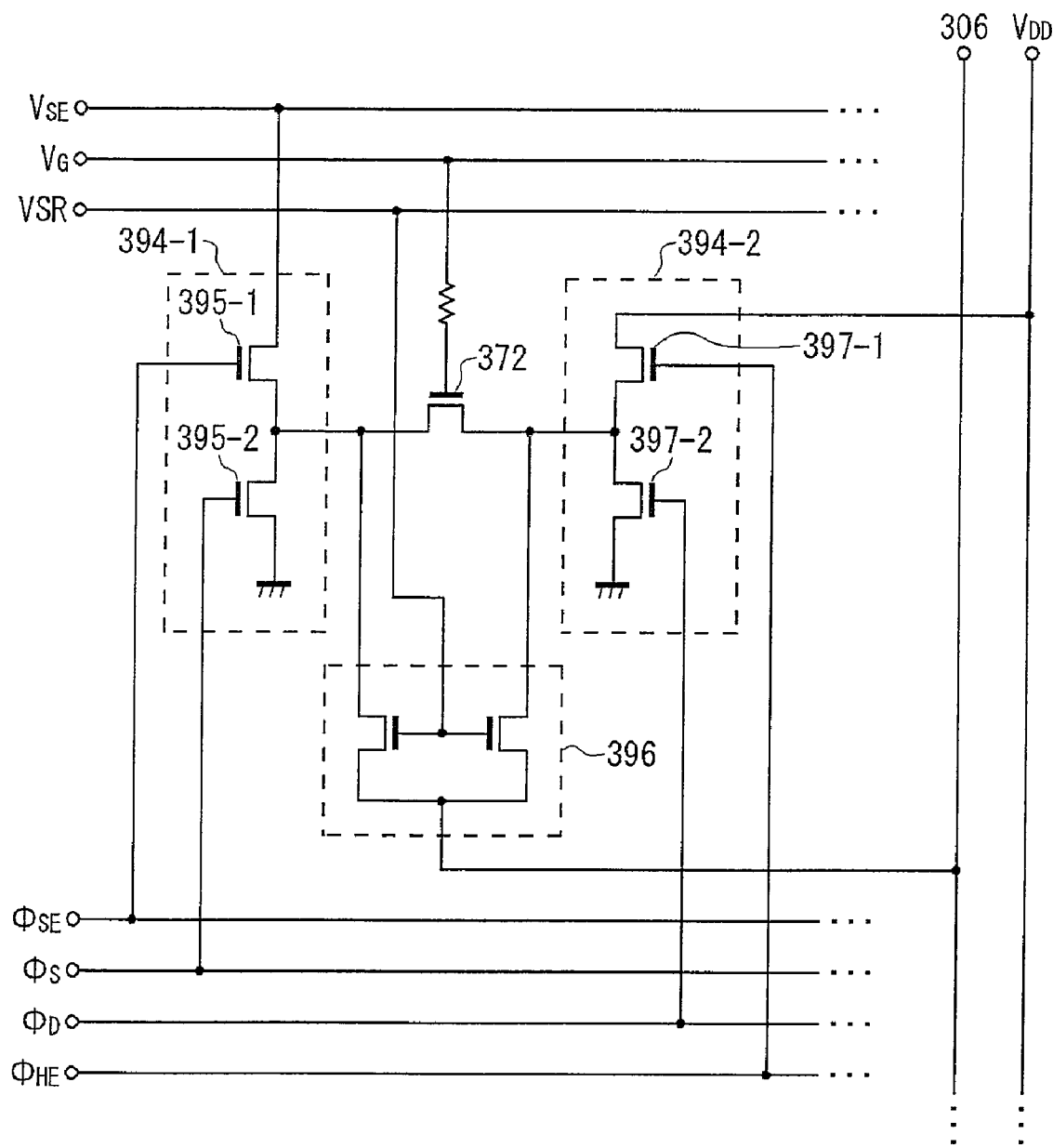
FIG. 12 is a diagram showing another example of the circuit configuration in the gate leak current measuring region 370.

FIG. 12 is a diagram showing another example of the circuit configuration of the gate leak current measuring region 370. As well as FIG. 10, FIG. 12 shows the configuration of each cell 310 in the gate leak current measuring region 370. Each cell 310 is supplied with voltages $V_{DD}$, $V_{SE}$, and $V_G$, and signals $\phi_{SE}$, $\phi_S$, $\phi_D$, and $\phi_{HE}$ from the control section 14, and supplied with a position signal converted from a selecting signal from the column-direction selecting section (VSR) 304.

Each cell 310 comprises a transistor under measurement 372, stress applying sections 394, and a column-direction selecting transistor 396. The stress applying sections 394 are supplied with the voltages $V_{SE}$ and $V_{DD}$, and the signals $\phi_{SE}$, $\phi_S$, $\phi_D$ and $\phi_{HE}$. The stress applying sections 394 are connected to the source terminal and drain terminal of the transistor under measurement 372, and apply a voltage to the source terminal and drain terminal of the transistor under measurement 372 in response to the signals supplied thereto.

In the present example, the stress applying sections 394 comprise a source-side stress applying section 394-1 connected to the source terminal of the transistor under measurement 372, and a drain-side stress applying section 394-2 connected to the drain terminal of the transistor under measurement 372.

The source-side stress applying section 394-1 comprises two transistors (395-1 and 395-2) provided in series between a bus line to be supplied with the voltage $V_{SE}$ and a ground potential. The source-drain connection node at which the two transistors (395-1 and 395-2) are connected is connected to the source terminal of the transistor under measurement 372. The signal $\phi_{SE}$ is supplied to the gate terminal of the transistor 395-1 at the bus line side. The signal $\phi_S$ is supplied to the gate terminal of the transistor 395-2 at the ground potential side.

The drain-side stress applying section 394-2 comprises two transistors (397-1 and 397-2) provided in series between a bus line to be supplied with the voltage $V_{DD}$ and the ground potential. The source-drain node at which the two transistors (397-1 and 397-2) are connected is connected to the drain terminal of the transistor under measurement 372. The signal $\phi_{HE}$ is supplied to the gate terminal of the transistor 397-1 at the bus line side. The signal $\phi_D$ is supplied to the gate terminal of the transistor 397-2 at the ground potential side.

The control section 14 applies the signal $\phi_{SE}$, the signal $\phi_S$, the signal $\phi_D$, and the signal $\phi_{HE}$ to the stress applying sections 394. In response to the signals supplied, the stress applying sections 394 apply the stresses of (1) to (4) explained with reference to FIG. 10 to the transistor under measurement 372. For example, when applying a stress of (4) Source Erase to the transistor under measurement 372, the control section 14 supplies the signal $\phi_S$ which indicates H level to the stress applying sections 394.

When applying a stress of (2) FN Substrate injection, the control section 14 may supply the signal $\phi_{SE}$ which indicates H level. When applying a stress of (3) Hot Electron injection, the control section 14 may supply the signal $\phi_{HE}$ which indicates H level. Further, when applying a stress of (1) FN Gate injection, the control section 14 may apply the signal $\phi_D$ which becomes H level.

In this manner, by the control section 14 controlling the signal $\phi_{SE}$, the signal $\phi_S$, the signal $\phi_D$, and the signal $\phi_{HE}$ in accordance with the stress that should be applied, it is possible to apply the voltages corresponding to the stress that should be applied, to the source terminal and drain terminal of the transistor under measurement 372.

After making the stress applying sections 394 sequentially apply the above-described stresses, the measuring apparatus 100 measures a gate leak current of the transistor under measurement 372. At this time, a predetermined gate voltage $V_G$ is applied to the gate terminal of the transistor under measurement 372. Then, the column-direction selecting section 304 controls the column-direction selecting transistor 396 to be turned ON.

The column-direction selecting transistor 396 comprises a transistor which is connected to the source terminal of the transistor under measurement 372 for switching between allowing and not allowing the source current to pass therethrough, and a transistor which is connected to the drain terminal for switching between allowing and not allowing the drain current to pass therethrough. With this configuration, regardless of whether the transistor under measurement 372 is P type or N type, its gate leak current can be allowed to pass.

Further, in a case where each cell 310 has the configuration shown in FIG. 12, the gate leak current is supplied to the output section 320. In the present example, the output section 320 has the function of outputting a current value. And the characteristic measuring section 16 detects the gate leak current characteristic of the transistor under measurement 372 based on the current value output from the output section 320. This configuration can also enable measurement of the gate leak currents of the respective transistors under measurement 372 and calculation of unevenness in the gate leak currents.

Figure 13:
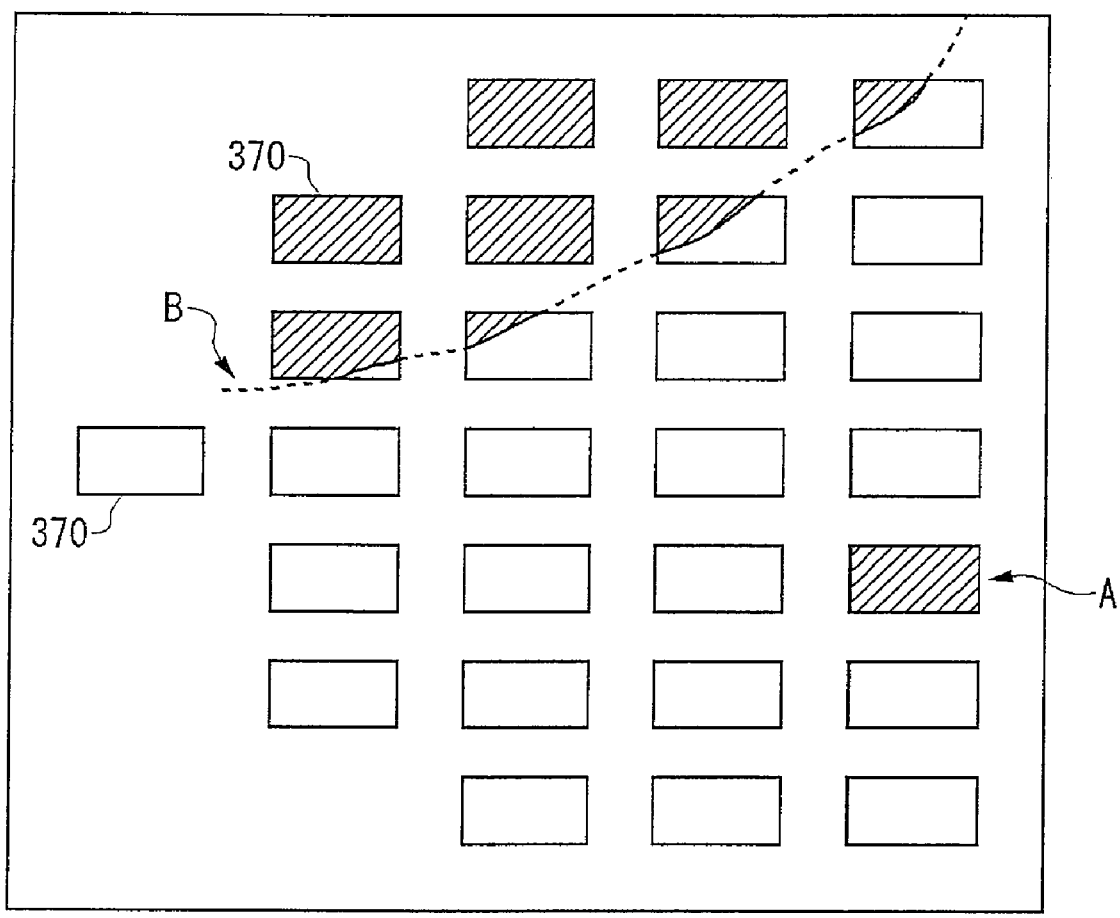
FIG. 13 is a diagram showing unevenness in gate leak currents displayed by the display section of the display apparatus 18.

FIG. 13 is a diagram showing unevenness in the gate leak currents displayed by the display section of the display apparatus 18. The display apparatus 18 comprises a storage section which stores the gate leak current of each transistor under measurement 372 measured by the measuring apparatus 100 in association with the position of the transistor under measurement 372 within the surface of the wafer 500, and a display section which displays unevenness in the gate leak currents. The storage section may receive a gate leak current from the characteristic measuring section 16 and receive position information of the transistor under measurement 372 corresponding to this gate leak current from the control section 14. The control section 14 may supply a selecting signal to be supplied to the circuit under test 300 to the storage section as the position information of the transistor under measurement 372.

As shown in FIG. 13, the display section displays the gate leak current measuring region 370 of each circuit under test 300 provided on the wafer 500 explained with reference to FIG. 3. In the present example, the circuits under test 300 are provided inside the electronic devices 510 respectively. The display section displays each gate leak current measuring region 370 at coordinates corresponding to the position of the gate leak current measuring region 370 on its display surface, which corresponds to a surface portion of the wafer 500. Further, the display section displays characteristic information corresponding to the current value of the gate leak current of each transistor under measurement 372, at the coordinates corresponding to the position of the transistor under measurement 372.

Here, the characteristic information may be displayed as a dot having brightness corresponding to the current value of each gate leak current, at the coordinates on the display surface that correspond to each transistor under measurement 372. Alternately, the characteristic information may be displayed as a dot having a hue corresponding to the current value of each gate leak current, at the coordinates on the display surface that correspond to each transistor under measurement 372.

By displaying the unevenness in the threshold voltages of the transistors under measurement 372 correspondingly to the positions of the respective transistors under measurement 372 in this manner, it is possible to visualize the distribution of the unevenness in the gate leak currents in the circuit. Further, by displaying the unevenness in the gate leak currents within the surface of the wafer 500, it is possible to facilitate extraction of any defective devices and analysis of factors of the unevenness, etc.

For example, as shown by A in FIG. 13, in a case where the gate leak currents of transistors under measurement 372 are large all over an entire gate leak current measuring region 370, it is possible to estimate that the whole electronic device 510 in which this gate leak current measuring region 370 is provided is defective. Further, as shown by B in FIG. 13, in a case where regions in which gate leak currents are large and regions in which gate leak currents are small appear over a plurality of gate leak current measuring regions 370 along a predetermined shape, it is possible to estimate that a cleaning step in forming elements on the wafer 500 has failed in even cleaning.

Figure 14:
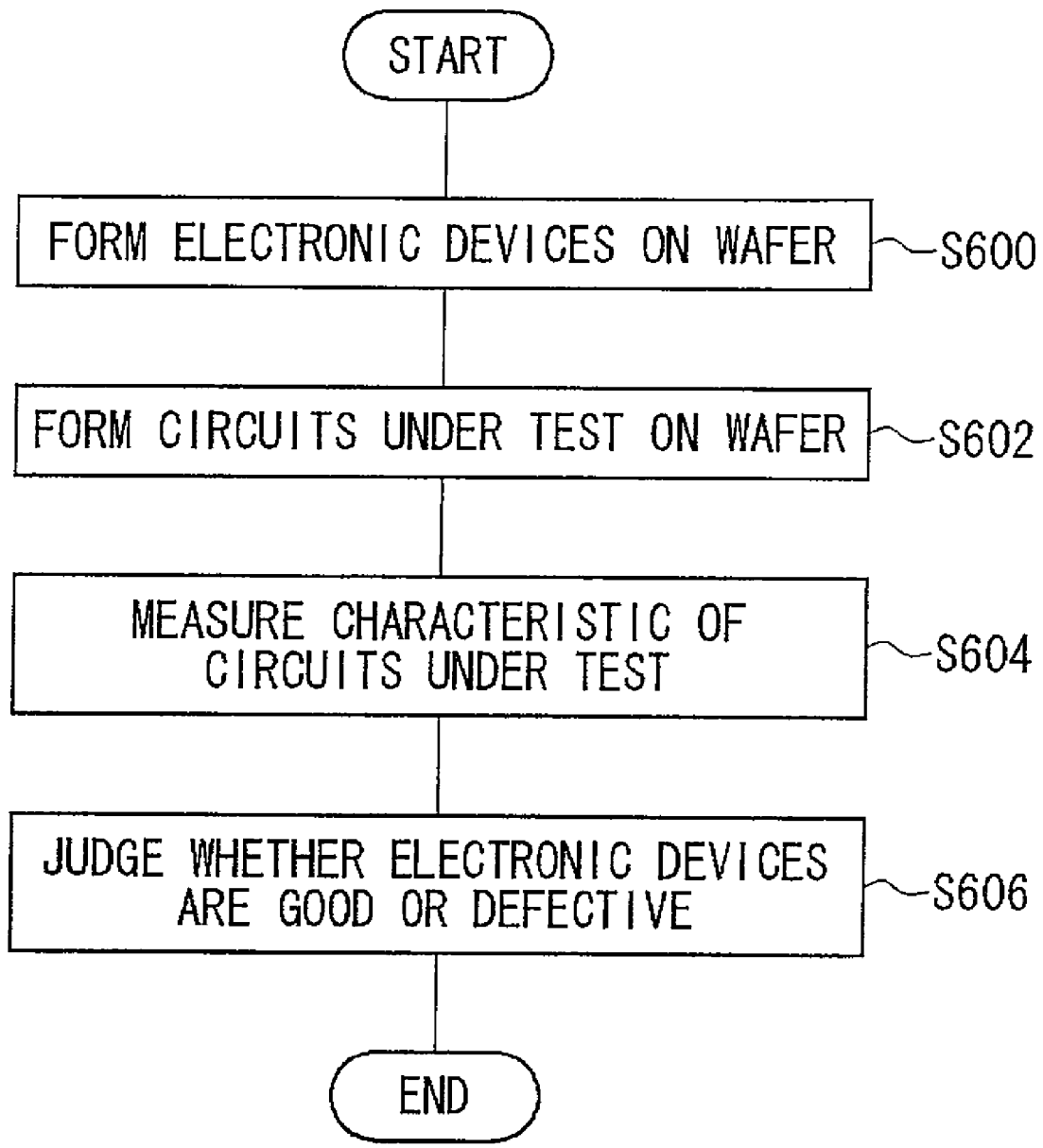
FIG. 14 is a flowchart showing one example of a device manufacturing method for forming a plurality of electronic devices 510 on a wafer 500.

FIG. 14 is a flowchart showing one example of a device manufacturing method for forming a plurality of electronic devices 510 on a wafer 500. First, a plurality of electronic devices 510 are formed on the wafer 500 (S600). A plurality of circuits under test 300 is formed on the wafer 500 (S602). At S600 and S602, the electronic devices 510 and the circuits under test 300 are formed through the same process. The circuits under test 300 are formed inside the electronic devices 510 respectively.

Further, at S602, the circuits under test 300 explained with reference to FIG. 4, 10, or 12 are formed. For example, in a case where the circuits under test 300 explained with reference to FIG. 4 are formed, S602 comprises a step of forming the respective elements shown in FIG. 4, such as the plurality of transistors under measurement 314, the selecting sections (302, 304), the output section 320, etc. on each circuit under test 300.

Then, electric characteristics of the circuits under test 300 are measured (S604). At S604, unevenness in threshold voltage, current-voltage characteristic, PN junction leak current, gate leak current, etc. of the transistors under measurement provided in each circuit under test 300 is measured as explained with reference to FIG. 5, 8, 9, or 11. Then, based on the unevenness in the aforesaid characteristics in each circuit under test 300, whether the corresponding electronic device 510 is good or defective is judged.

By such a method, it is possible to judge whether the electronic device 510 is good or defective, without operating the actual operation elements of the electronic device 510. Further, as explained with reference to FIG. 13, by displaying unevenness in the characteristic of the respective elements on the wafer 500 correspondingly to the positions of the respective elements, it is possible to facilitate defect analysis. It is also possible to use the analysis result as feedback in designing electronic devices 510.

One aspect of the present invention have been explained above using embodiments, but the technical scope of the present invention is not limited to the scope of disclosure of the above-described embodiments. Various modifications or alterations can be made upon the above-described embodiments. It is obvious from the statements of the claims that embodiments upon which such modifications or alterations are made are also included in the technical scope of the present invention.

As obvious from the above explanation, according to the embodiments of the present invention, it is possible to measure accurately and in a short time, unevenness in threshold voltage, current-voltage characteristic, and leak current of multiple transistors under measurement provided within the surface of a wafer. Further, it is possible to facilitate identification of defective portions and analysis of the cause, by displaying distribution of the unevenness in the characteristics within the surface of the wafer.

What is claimed is:

1. A circuit under test, comprising:
   a plurality of transistors under measurement, to which respective gate voltages are applied, provided in electrically parallel;
   a selecting section which sequentially selects the respective transistors under measurement;
   an output section which sequentially outputs source voltages of the transistors under measurement selected sequentially by the selecting section; and
   a current source section for defining source-drain currents of the transistor under measurement,
   wherein the current source section includes a plurality of current source transistors that receive common reference voltage at gate terminals thereof so that each current source transistor generates a common constant current as the source-drain current.

2. The circuit under test according to claim 1, further comprising:
   a plurality of gate voltage control sections which are provided correspondingly to the plurality of transistors under measurement for applying a predetermined gate voltage to gate terminals of the corresponding transistors under measurement respectively,
   wherein the output section sequentially outputs the source voltages of the transistors under measurement selected sequentially by the selecting section, and
   the current source section includes a plurality of current sources which are provided correspondingly to the plurality of transistors under measurement for defining source-drain currents of the corresponding transistors under measurement.

3. The circuit under test according to claim 1, wherein
   the plurality of transistors under measurement are further provided in electrically parallel in columns, such that the transistors under measurement form a row-column matrix, and
   the selecting section includes:
   a row-direction selecting section which selects positions of the transistors under measurement in a direction of the row; and
   a column-direction selecting section which selects positions of the transistors under measurement in a direction of the column.

4. The circuit under test according to claim 3,
   wherein the row-direction selecting section and the column-direction selecting section each include a circuit which converts a selecting signal supplied thereto into a position signal indicating the position of the transistor under measurement.

5. The circuit under test according to claim 3, further comprising:
   a plurality of column-direction selecting transistors which are provided correspondingly to the plurality of transistors under measurement, for receiving, at their drain terminals, the source voltages of the corresponding transistors under measurement; and
   a plurality of row-direction selecting transistors which are provided correspondingly to positions in the direction of the row at which the transistors under measurement are provided, for selecting whether or not to supply source voltages of the column-direction selecting transistors provided correspondingly to the positions in the direction of the row to the characteristic measuring section,
   wherein the column-direction selecting section controls the plurality of column-direction selecting transistors to be turned ON sequentially from those corresponding to a position in the direction of the column to those corresponding to another position in the direction of the column, and
   the row-direction selecting section controls the plurality of row-direction selecting transistors to be turned ON sequentially.

6. The circuit under test according to claim 3,
   wherein the current sources are provided in common for the plurality of transistors under measurement which are provided along the direction of the column.

7. The circuit under test according to claim 3,
   wherein the plurality of transistors under measurement are formed with process rules or device sizes, which are predetermined for the positions in the direction of the row respectively.

8. The circuit under test according to claim 2,
   wherein the respective gate voltage control sections of the circuit under test include switching transistors which have PN junctions that are connected to the gate terminals of the transistors under measurement, and
   the switching transistors apply the gate voltage for turning the transistors under measurement ON and the gate voltage for turning the transistors under measurement OFF, to the transistors under measurement.

9. A wafer on which the circuit under test according to claim 1 is provided on a boundary between respective semiconductor circuits.

10. A wafer, comprising a plurality of the circuits under test according to claim 1, correspondingly to a plurality of semiconductor circuits,
    wherein each of the circuits under test is provided inside the corresponding semiconductor circuit.

11. A measuring apparatus for measuring an electric characteristic of a circuit under test, wherein the circuit comprises:
    a plurality of transistors under measurement, to which respective gate voltages are applied, provided in electrically parallel;
    a selecting section which sequentially selects the respective transistors under measurement;
    an output section which sequentially outputs source voltages of the transistors under measurement selected sequentially by the selecting section;
    a plurality of current sources which are provided correspondingly to the plurality of transistors under measurement for defining source-drain currents of the corresponding transistors under measurement; and
    a plurality of gate voltage control sections which are correspondingly to the plurality of transistors under measurement for applying a predetermined gate voltage to gate terminals of the corresponding transistors under measurement respectively,
    wherein the output section sequentially outputs the source voltages of the transistors under measurement selected sequentially by the selecting section,
    the measuring apparatus comprising:
    a gate control section which controls each of the gate voltage control sections to apply the gate voltage for controlling the corresponding transistor under measurement to be ON, to the gate terminal of the corresponding transistor under measurement; and
    a characteristic measuring section which calculates a threshold voltage of each of the transistors under measurement, based on the gate voltage of the transistor under measurement and the source voltage of the transistor under measurement output from the output section.

12. The measuring apparatus according to claim 11, further comprising a current control section which controls the respective current sources to generate the source-drain currents which are generally the same,
wherein the characteristic measuring section calculates unevenness in the threshold voltages of the respective transistors under measurement.

13. The measuring apparatus according to claim 11, further comprising a current control section which sequentially changes the source-drain current generated by each of the current sources,
wherein the characteristic measuring section measures the source voltage of each of the transistors under measurement at each level of the source-drain current sequentially changed by the current control section to calculate a current-voltage characteristic of the transistor under measurement.

14. A measuring apparatus for measuring an electric characteristic of a circuit under test, wherein the circuit comprises:
a plurality of transistors under measurement, to which respective gate voltages are applied, provided in electrically parallel;
a selecting section which sequentially selects the respective transistors under measurement;
an output section which sequentially outputs source voltages of the transistors under measurement selected sequentially by the selecting section;
a plurality of current sources which are provided correspondingly to the plurality of transistors under measurement for defining source-drain currents of the corresponding transistors under measurement; and
a plurality of gate voltage control sections which are provided correspondingly to the plurality of transistors under measurement for applying a predetermined gate voltage to gate terminals of the corresponding transistors under measurement respectively,
wherein the output section sequentially outputs the source voltages of the transistors under measurement selected sequentially by the selecting section,
wherein the respective gate voltage control sections of the circuit under test include switching transistors which have PN junctions that are connected to the gate terminals of the transistors under measurement, and
the switching transistors apply the gate voltage for turning the transistors under measurement ON and the gate voltage for turning the transistors under measurement OFF, to the transistors under measurement,
the measuring apparatus comprising:
a gate control section which controls the respective switching transistors to sequentially apply the gate voltage for turning the corresponding transistors under measurement ON and the gate voltage for turning the corresponding transistors under measurement OFF, to the transistors under measurement; and
a characteristic measuring section which measures the source voltage of each of the transistors under measurement when it is turned ON and the source voltage of the transistor under measurement when a predetermined period passes after it is switched from ON to OFF, to calculate a leak current in the PN junction based on a change in the source voltage.

15. A measuring method for measuring an electric characteristic of a circuit under test comprising:
a plurality of transistors under measurement, to which respective gate voltages are applied, provided in electrically parallel;
a selecting section which sequentially selects the respective transistors under measurement;
an output section which sequentially outputs source voltages of the transistors under measurement selected sequentially by the selecting section;
a plurality of current sources which are provided correspondingly to the plurality of transistors under measurement for defining source-drain currents of the corresponding transistors under measurement; and
a plurality of gate voltage control sections which are provided correspondingly to the plurality of transistors under measurement for applying a predetermined gate voltage to gate terminals of the corresponding transistors under measurement respectively,
wherein the output section sequentially outputs the source voltages of the transistors under measurement selected sequentially by the selecting section,
the measuring method comprising:
controlling each of the gate voltage control sections to apply the gate voltage for controlling the corresponding transistor under measurement to be ON, to the gate terminal of the corresponding transistor under measurement; and
calculating a threshold voltage of each of the transistors under measurement, based on the gate voltage of the transistor under measurement and the source voltage of the transistor under measurement output from the output section.

16. The measuring method according to claim 15, further comprising controlling the respective current sources to generate the source-drain currents which are generally the same,
wherein calculating the threshold voltage includes calculating unevenness in the threshold voltages of the respective transistors under measurement.

17. the measuring method according to claim 15, further comprising sequentially changing the source-drain current generated by each of the current sources,
wherein calculating the threshold voltage includes measuring the source voltage of each of the transistors under measurement at each level of the source-drain current which is sequentially changed in the sequentially changing the source-drain current, thereby calculating a current-voltage characteristic of the transistor under measurement.

18. A measuring method for measuring an electric characteristic of a circuit under test comprising:
a plurality of transistors under measurement, to which respective gate voltages are applied, provided in electrically parallel;
a selecting section which sequentially selects the respective transistors under measurement;
an output section which sequentially outputs source voltages of the transistors under measurement selected sequentially by the selecting section;
a plurality of current sources which are provided correspondingly to the plurality of transistors under measurement for defining source-drain currents of the corresponding transistors under measurement; and
a plurality of gate voltage control sections which are provided correspondingly to the plurality of transistors under measurement for applying a predetermined gate voltage to gate terminals of the corresponding transistors under measurement respectively, wherein the output section sequentially outputs the source voltages of the transistors under measurement selected sequentially by the selecting section, wherein the respective gate voltage control sections of the circuit under test include switching transistors which have PN junctions that are connected to the gate terminals of the transistors under measurement, and the switching transistors apply the gate voltage for turning the transistors under measurement ON and the gate voltage for turning the transistors under measurement OFF, to the transistors under measurement, the measuring method comprising:

controlling each of the switching transistors to sequentially apply the gate voltage for turning the corresponding transistor under measurement ON and the gate voltage for turning the transistor under measurement OFF to the transistor under measurement; and measuring the source voltage of each of the transistors under measurement when it is turned ON and the source voltage of the transistor under measurement when a predetermined time passes after it is switched from ON to OFF, and calculating a leak current in the PN junction based on an amount of change in the source voltage.

\* \* \* \* \*